(12) United States Patent
Daniel et al.

(10) Patent No.: US 7,288,327 B2
(45) Date of Patent: Oct. 30, 2007

(54) PLATED STRUCTURES OR COMPONENTS

(75) Inventors: Jurgen Daniel, Mountain View, CA (US); Brent S. Krusor, Fremont, CA (US); Alexandra Rodkin, San Francisco, CA (US); John S Fitch, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 285 days.

(21) Appl. No.: 11/014,357

(22) Filed: Dec. 16, 2004

(65) Prior Publication Data

US 2006/0134448 A1    Jun. 22, 2006

(51) Int. Cl.
  *B32B 3/02*       (2006.01)
  *B32B 3/30*       (2006.01)
  *C25D 1/08*       (2006.01)
  *C25D 5/02*       (2006.01)
  *C25D 5/16*       (2006.01)

(52) U.S. Cl. ............... 428/599; 428/600; 428/596; 428/598; 428/935; 205/75; 205/118

(58) Field of Classification Search ............ None
  See application file for complete search history.

(56) References Cited

U.S. PATENT DOCUMENTS 2,246,380 A * 6/1941 Norris .................. 205/75
3,376,210 A * 4/1968 Buske et al ............ 204/297.11
4,675,083 A * 6/1987 Bearss et al. ............ 205/50
4,954,225 A * 9/1990 Bakewell .............. 205/75
6,334,856 B1   1/2002 Allen et al.

(Continued)

OTHER PUBLICATIONS

Moreno, J.D, Marcos, M.L., Agullo-Rueda, F., Guerrero-Lemus, R., Martin-Palma, R.J., Martinez-Duart, J.M., and Gonzales-Velasco, J., "A galvanostatic study of the electrodeposoition of polypyrrole into porous silicon," Thin Solid Films, 348 (1999), pp. 152-156.

(Continued)

*Primary Examiner*—John J Zimmerman
(74) *Attorney, Agent, or Firm*—Leading-Edge Law Group, PLC; James T. Beran

(57) ABSTRACT

Various structures or components can include plated surfaces or other parts. For example, an article can include a base and a plated part with a limit artifact that results from plating adjacent a non-plateable surface; the limit artifact can be disposed away from the base. Exemplary limit artifacts include lack of protrusions, smooth upper surfaces, and curved surfaces, where a curved surface can transition between a smooth upper surface and an irregular side surface. Exemplary plated structures can be tube-shaped or cup-shaped, with an opening at a top end and, around the opening, a lip with a limit artifact. Wall-like structures can similarly have limit artifacts at their top end. If plating on a mold's side surface, the non-plateable surface can be the lower surface of an overhanging polymer disk or structure positioned on the mold. Plated tubes and wall-like structures can be employed in microfluidic structures.

35 Claims, 20 Drawing Sheets

U.S. PATENT DOCUMENTS

| | | | |
|---|---|---|---|
| 6,458,231 | B1 | 10/2002 | Wapner et al. |
| 6,528,350 | B2 | 3/2003 | Fork |
| 6,616,966 | B2 | 9/2003 | Mathieu et al. |
| 6,644,791 | B1 | 11/2003 | Andrews |
| 6,663,820 | B2 | 12/2003 | Arias et al. |
| 6,800,849 | B2 | 10/2004 | Staats |
| 7,118,389 | B2 | 10/2006 | Fork et al. |
| 2002/0019133 | A1* | 2/2002 | Toya et al. ............ 438/689 |
| 2003/0208167 | A1 | 11/2003 | Prausnitz et al. |
| 2005/0282411 | A1* | 12/2005 | Fork et al. ............ 439/74 |
| 2006/0070226 | A1 | 4/2006 | Daniel et al. |
| 2006/0087064 | A1 | 4/2006 | Daniel et al. |
| 2006/0132531 | A1 | 6/2006 | Fitch et al. |

OTHER PUBLICATIONS

Jakob, C., Erler, F., Nutsch, R., Steinhauser, S., Wielage, B., Zschunke, A., 15th Interfinish 2000 of the IUSF, Garmisch-Partenkirchen, Germany, Sep. 13-15, 2000, pp. 1-11.

Shah, K., Iroh, J.O., "Adhesion of Electrochemically Formed Conducting Polymer Coatings on Al-," Surface Engineering, vol. 20, No. 1, Feb. 1, 2004, pp. 53-58, abstracted at www.ingenta.com/isis/searching/ExpandTOC/ingenta?issue=pubinfobike://maney/se/2004/00000020/00000001&index?11, abstract printed May 20, 2004.

Riley, G., "Stud Bumping 300 mm Wafers," published at the Web site www.flipchips.com/update14.html (2 pages), printed Jul. 7, 2004.

Description of electrodeposition of calcareous deposits at the Stanford University Web site www.stanford.edu/~erlee/seament/seament.htm (4 pages), printed Nov. 11, 2004.

* cited by examiner

US 7,288,327 B2

PLATED STRUCTURES OR COMPONENTS

BACKGROUND OF THE INVENTION

The present invention relates generally to techniques for structures and components that are plated. The invention also relates to plating techniques such as electroless plating, electroplating, and other electrodeposition techniques.

Various techniques for fabricating plated structures and components have been proposed. U.S. Pat. No. 6,334,856, for example, describes a method for making a microneedle by forming a micromold with sidewalls that define the outer microneedle surface, electroplating the sidewalls to form the hollow microneedle, and then removing the micromold. U.S. Pat. No. 6,528,350 similarly describes a method for fabricating metal plated spring structures in which metal is plated onto a spring structure after release. U.S. Pat. No. 6,616,966 describes a method of forming an interconnection, including a spring contact element, in which conductive materials are deposited in several ways, with suitable deposition techniques including electroplating and electroless plating.

Previous techniques, however, are limited in the variety of structures and components they provide. It would be advantageous to have additional techniques for plated structures and components. It would also be advantageous to have additional plating techniques.

SUMMARY OF THE INVENTION

The invention provides various exemplary embodiments of articles of manufacture, structures, apparatus, and methods. The structures include microstructures and microfluidic structures. In general, each embodiment involves a surface, an end, a lip around at least part of an opening, a wall-like structure, a microstructure, or other part that can be characterized as plated.

These and other features and advantages of exemplary embodiments of the invention are described below with reference to the accompanying drawings, in which like reference numerals refer to components that are alike or similar in structure or function.

DETAILED DESCRIPTION

Figure 1:
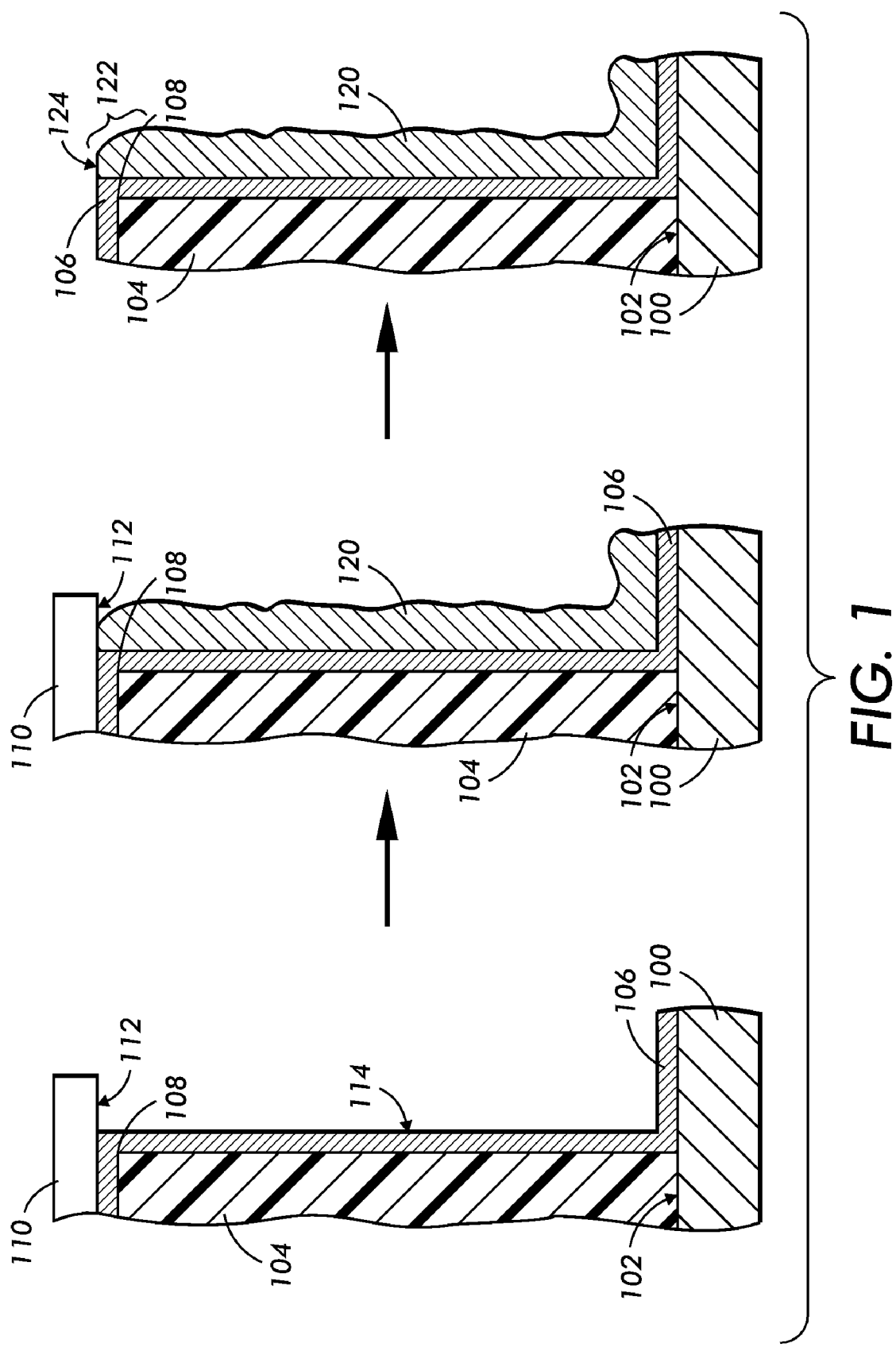
FIG. 1 is a sequence of cross-sectional views of three stages in producing a structure with artifacts from plating a top end or lip adjacent a non-plateable surface.

In the following detailed description, numeric ranges are provided for various aspects of the implementations described. These recited ranges are to be treated as examples only, and are not intended to limit the scope of the claims. In addition, a number of materials are identified as suitable for various facets of the implementations. These recited materials are to be treated as exemplary, and are not intended to limit the scope of the claims.

Various techniques have been developed for producing structures with one or more dimensions smaller than 1 mm. In particular, some techniques for producing such structures are referred to as "microfabrication." Examples of microfabrication include various techniques for depositing materials such as sputter deposition, evaporation techniques, plating techniques, spin coating, and other such techniques; techniques for patterning materials, such as photolithography; techniques for polishing, planarizing, or otherwise modifying exposed surfaces of materials; and so forth.

In general, structures, elements, and components described herein are supported on a "support structure" or "support surface", which terms are used herein to mean a structure or a structure's surface that can support other structures; more specifically, a support structure could be a "substrate", used herein to mean a support structure on a surface of which other structures can be formed or attached by microfabrication or similar processes.

The surface of a substrate or other support structure is treated herein as providing a directional orientation as follows: A direction away from the surface is "up" or "over", while a direction toward the surface is "down" or "under". The terms "upper" and "top" are typically applied to structures, components, or surfaces disposed away from the surface, while "lower" or "underlying" are applied to structures, components, or surfaces disposed toward the surface.

In general, it should be understood that the above directional orientation is arbitrary and only for ease of description, and that a support structure or substrate may have any appropriate orientation.

A process that produces a layer or other accumulation of material on structures or components over a substrate's surface can be said to "deposit" the material, in contrast to processes that attach a part such as by forming a wire bond. A structure or component over which material is deposited and that has a shape that is followed by the deposited material is sometimes referred to herein as a "mold".

A part, component, structure, material, surface, or other element is described herein as "plated" if it was produced by plating material, such as by electroless plating, electroplating, or other electrodeposition. For purposes of this description, the following operations are not considered as plating of material: epitaxial growth; spin coating or other liquid deposition, such as of photoresist or other polymer material; sputter deposition of material; deposition by evaporation; mechanical placement or attachment of two solid components, such as by frictional contact or bonding with adhesive, solder, thermal bonding, or another technique; and so forth.

A structure or component is "positioned on" another when it is both over and in contact with the other or with a layer of material on the other. An "overhanging" structure or component is one that is positioned on another but extends or projects beyond the edge or other boundary of the surface it is positioned on.

A structure or component is "directly on" a surface when it is both over and in contact with the surface. A structure is "fabricated on" a surface when the structure was produced on or over the surface by microfabrication or similar processes. A structure or component is "attached" to another when the two have surfaces that contact each other and the contacting surfaces are held together by more than mere mechanical contact, such as by an adhesive, a thermal bond, or a fastener, for example.

Some exemplary implementations of the invention are "microstructures", a term used herein to mean a structure with a maximum dimension less than 10 mm and with at least one outside dimension less than 1.0 mm. For example, a relatively large microstructure could be 5.0 mm high and 0.5 mm wide. In general, no minimum dimension is specified for microstructures, but specific materials, functional characteristics, or other constraints may require that a microstructure have at least some appropriate minimum dimension.

Also, some exemplary implementations of the invention involve fluidic techniques. The terms "fluidic structure" and "channel" are used herein with related meanings: A "fluidic structure" is a structure that depends for its operation on fluid positioning or fluid flow, such as, for liquids or gases, in response to pressure or, for liquids, as a result of surface tension effects; a "channel" is any tube or other enclosed passage within a fluidic structure through which fluid flows during operation. In general, a "transverse cross-section" of a channel is a cross-section of the channel taken substantially perpendicular to fluid flow direction.

The related term "microfluidic structure" is used herein to mean a fluidic structure with at least one channel with a transverse cross-section that has a maximum inner dimension no greater than 1.0 mm. For example, if the transverse cross-section of the channel is approximately circular, the maximum inner dimension would be the maximum diameter.

FIG. 1 shows a sequence of three cross-sectional views, each showing a stage in producing a structure on substrate 100, with components of the structure supported on surface 102 of substrate 100. Each view shows mold 104, which can, for example, be a structure formed photolithographically from a layer of photoresist or formed in any other suitable manner from any appropriate material, such as by embossing, molding, laser ablation, deep silicon etching, and so forth. Each view also shows seed layer 106, a conformal layer upon which material can be plated, such as by electroless plating, electroplating, or other electrodeposition.

Mold 104 illustratively has a side surface and an upper surface, and the two surfaces meet at edge 108. Consistent with the above directional orientation, the upper surface is disposed away from surface 102, while the side surface extends from surface 102 up to edge 108. More generally, a "side surface" is applied to a surface of a mold or other structure or component that also has an upper surface; in contrast to the upper surface, the side surface extends at least partially in a direction toward or away from a support surface rather than being disposed completely away from or toward it. Side surfaces, for example, can be perpendicular to the support surface or "oblique" to it, meaning neither perpendicular nor parallel.

Seed layer 106 covers the upper surface and side surface of mold 104, and also covers exposed regions of surface 102. Seed layer 106 and its exposed surfaces and any other components, layers, or surfaces on which material can be plated are referred to herein as "plateable." In some implementations, seed layer 106 may be unnecessary for plating if an exposed surface of mold 104 is plateable.

The left view in FIG. 1 also shows overhanging structure 110, which has a "non-plateable" lower surface 112, meaning that surface 112 cannot be plated or that only a random, negligible amount of plating material is deposited on surface 112 during plating of plateable surfaces. Seed layer 106 is exposed on the side surface of mold 104, providing a plateable side surface 114. Where overhanging structure 110 is positioned on the upper surface of mold 104, seed layer 106 is not exposed and therefore cannot be plated. Structure 110 therefore prevents overplating of mold 104; lack of plating over mold 104 can be beneficial for various purposes, including subsequent removal of mold 104 without polishing.

The center view in FIG. 1 shows a stage in which plating has been performed, leaving plated material 120 on the exposed side surface 114 of mold 104, as well as in other areas where seed layer 106 is exposed, but with no overplating of mold 104. Also, since lower surface 112 of overhanging structure 110 is not plateable, plated structure 120 has a top end or lip formed on a plateable surface adjacent a non-plateable surface that prevents protrusions extending from the top end or lip. Although non-plateable surface 112 is shown as perpendicular to plateable surface 114, this is only illustrative, and the angle between adjacent plateable and non-plateable surfaces could range from less than 90° to more than 90°. Also, surfaces 112 and 114 need not be planar but could be curved or otherwise non-planar.

The center view in FIG. 1 therefore shows one of many possible examples of an end, a lip, or another such structure, component, part, or surface that is plated "adjacent" a non-plateable surface. In this context, a structure, component, part, or surface is plated "adjacent" a non-plateable surface when the distance from the structure, component, part, or surface to the non-plateable surface is small, typically less than the size of the structure, component, part, or surface, and when there is an absence of any other solid or semi-solid material between them during plating. Because of its adjacency and its non-plateable characteristic, the non-plateable surface results in plating artifacts in the structure or component, and such artifacts can be used in various ways in fabricating a structure on a surface. An artifact that results from plating adjacent a non-plateable surface is referred to herein as a "limit artifact" because the non-plateable surface has a limiting effect on the progress of plating.

The right view in FIG. 1 shows a stage after removal of overhanging structure 110. Limit artifacts from plating the top end or lip can be seen, including illustratively curved surface 122 and smooth upper surface 124. Curved surface 122, for example, may result from slower liquid flow of a plating solution through the region adjacent to lower surface 112 and the adjacent surface being plated. In addition, during electroplating, overhanging structure 110 may distort the electric field, which may also contribute to the formation of curved surface 122. Smooth surface 124 may result from the presence of lower surface 112, which ensures smoothness by preventing protrusions from extending upward from the top end or lip of plated structure 120.

FIG. 1 illustrates exemplary limit artifacts that have been observed, but it is possible that other limit artifacts could arise where plating is performed adjacent a non-plateable surface such as lower surface 112. In many applications, a smooth top surface as shown is beneficial for subsequent processing, because, for example, no polishing is needed before bonding such a surface to a top structure.

FIG. 1 also illustrates other plating artifacts. For example, the irregular side surface of plated material 120 below curved surface 122 is a plating artifact but not a limit artifact. In effect, curved surface 122 makes a transition between smooth upper surface 124 and the irregular side surface.

The implementation in FIG. 1 thus illustrates manufacture of an article that includes a body with a base and a plated part. As used herein, the term "base" refers to a part of a body or other structure on which the body is supported or could be supported during manufacture or in use. In FIG. 1, the base is illustratively the part on surface 102. The plated part is illustratively plated material 120, which has limit artifacts, including smooth upper surface 124 and curved surface 122. The limit artifacts are not disposed toward the base, but rather away from the base.

Figure 2:
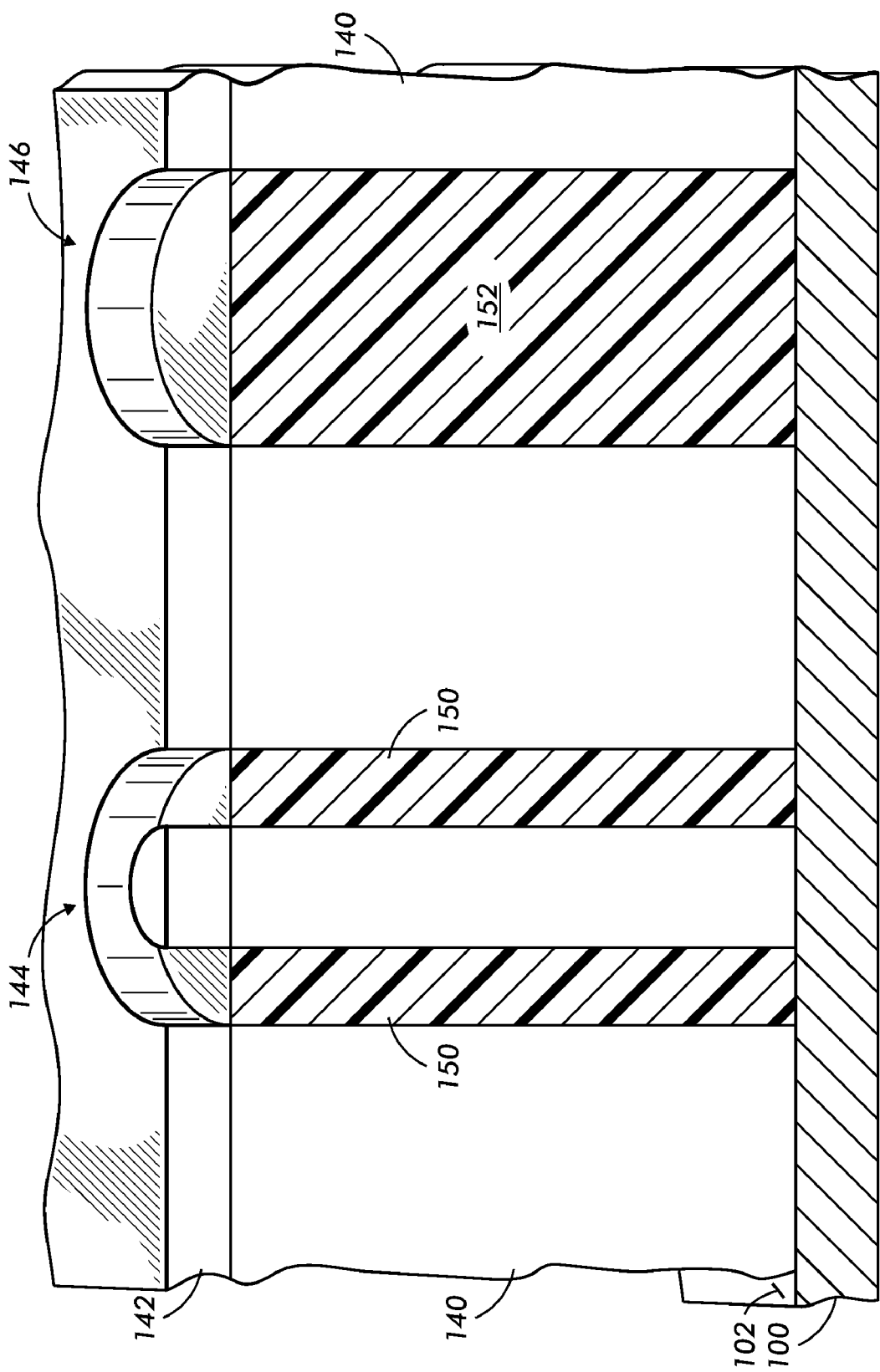
FIGS. 2 and 3 are cross-sectional views with upper surface perspective of stages in producing tube-shaped microstructures with top ends or lips plated adjacent non-plateable surfaces.
Figure 3:
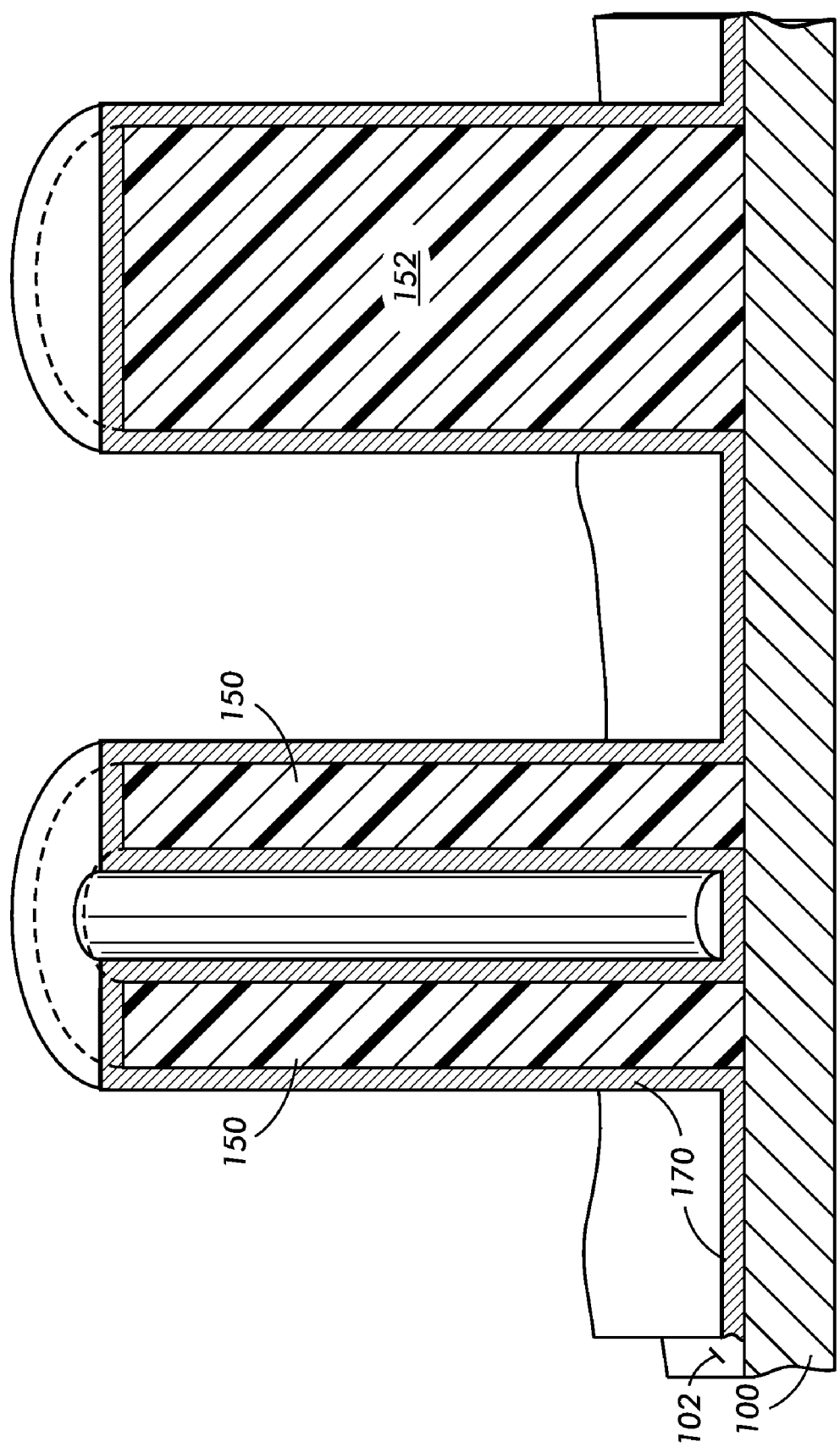

FIG. 2 shows a preliminary stage in a more specific technique that produces microstructures with top ends or lips similar to that of plated structure 120 in FIG. 1. Resist layer 140 has been spun or otherwise deposited on surface 102 of substrate 100. Mask 142, positioned on resist layer 140, includes an annular opening 144 and a circular opening 146. As a result, tubular region 150 and cylindrical region 152 of resist layer 140 have been photo-exposed. If resist layer 140 is, for example, SU-8 from MicroChem Inc. or another suitable negative photoresist, regions 150 and 152 will remain after development and removal of unexposed regions, as illustrated in FIG. 3. SU-8 is especially well suited for microstructures greater than 100 microns in height; for shorter microstructures, other negative photoresists such as NR9-8000 (from Futurrex, Inc.) or positive photoresists such as AZPLP-100 (from Clariant Corporation) could be used.

FIG. 3 thus shows tubular region 150 and cylindrical region 152 after development and removal of unexposed regions of resist layer 140. Regions 150 and 152 are of substantially equal length because both are produced from layer 140. In addition, an appropriate seed layer 170 has been deposited to provide surfaces for plating. Seed layer 170 can, for example, include any suitable metal or alloy, such as a chromium adhesion sublayer at a thickness of approximately 50 nm, followed by a gold layer at a thickness of approximately 100 nm, or any other plateable material, deposited by sputter coating, evaporation, cathodic arc deposition, or another appropriate process.

Figure 4:
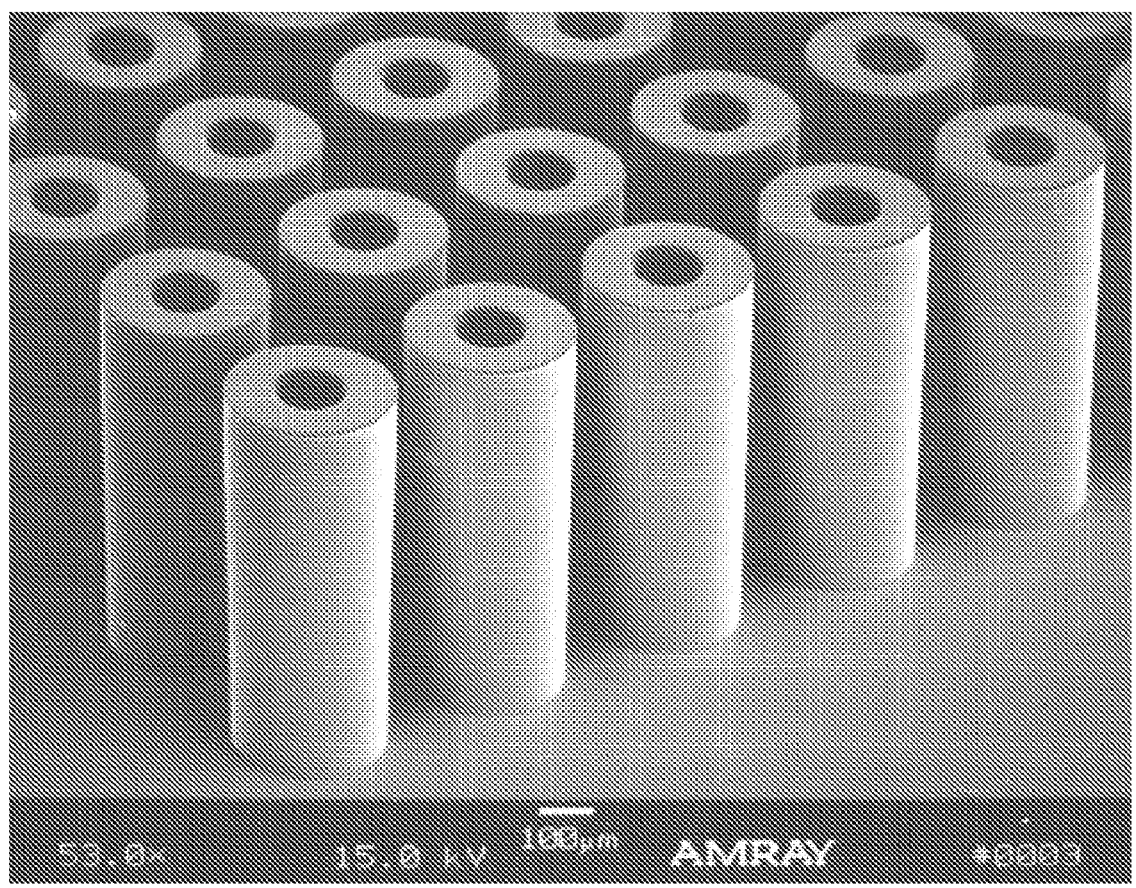
FIG. 4 is a photographic image of tubes formed by techniques similar to those shown in FIGS. 2 and 3.

FIG. 4 shows an array of tubes of SU-8 photoresist produced in the manner described above in relation to FIGS. 2 and 3 but not yet coated with seed layer 170. The tubes in FIG. 4 were produced on a stainless steel substrate, shown in the lower part of FIG. 4. Techniques for fabricating SU-8 structures are described in co-pending, co-assigned U.S. patent application Ser. No. 11/014,356, incorporated herein by reference.

Figure 5:
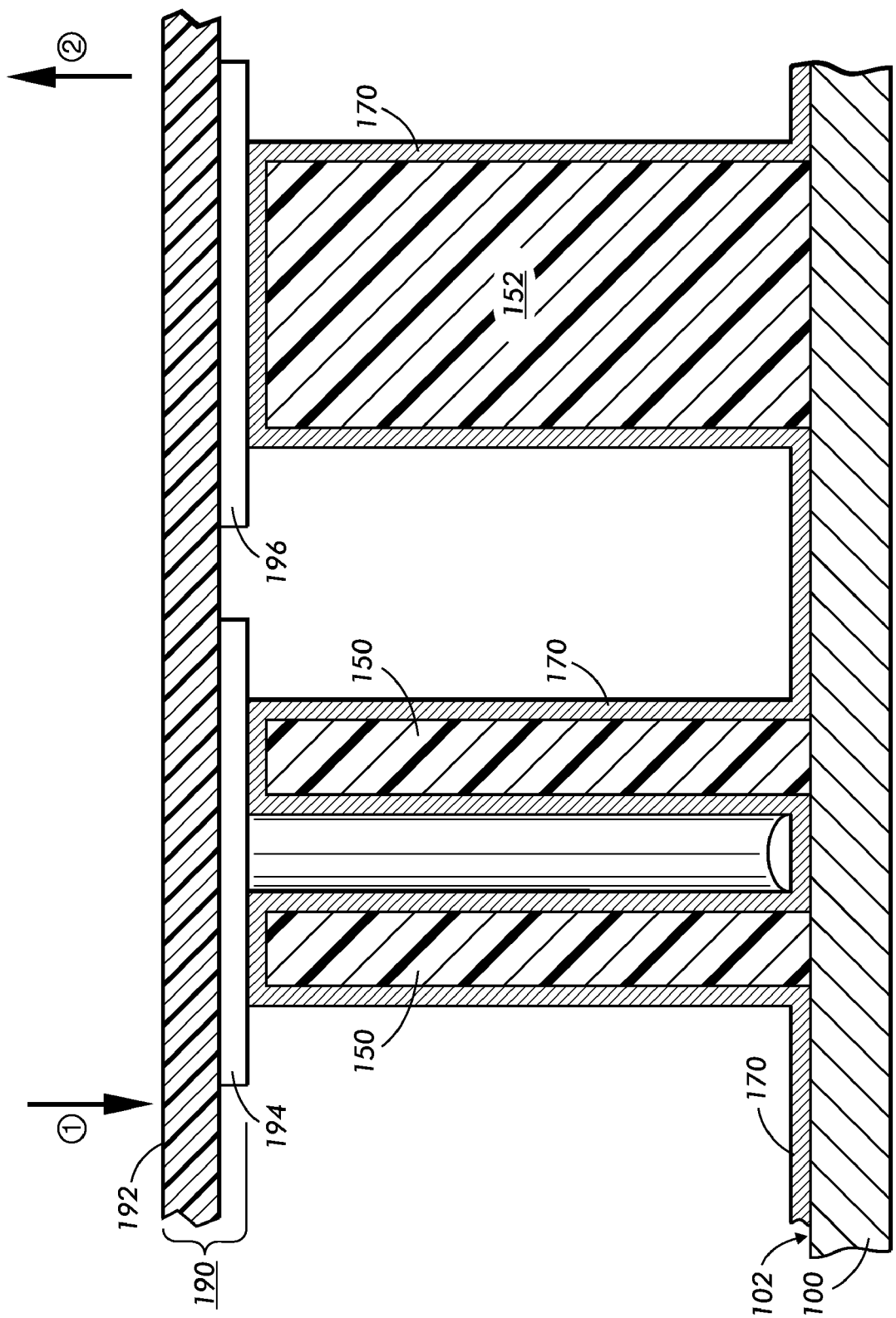
FIG. 5 is a cross-sectional view of a stage following the stage in FIG. 3.

FIG. 5 shows a stage following the stage in FIG. 3, with patterned laminate 190 bonded to the upper surfaces of tubular region 150 and cylindrical region 152. Patterned laminate 190 includes a support film 192, such as Mylar® film or another polyester or other polymer film, such as polyimide and so forth. Laminate 190 also includes, adhering to film 192, photoresist disks 194 and 196. As shown, disk 194 is larger in diameter than tubular region 150, while disk 196 is larger in diameter than cylindrical region 152; as a result, each disk, when properly positioned as shown in FIG. 5, overhangs and extends beyond the entire edge between the upper surface and the outer side surface of the region on which it is positioned. When patterned laminate 190 is properly aligned, as shown, disks 194 and 196 can be bonded to regions 150 and 152 by pressing laminate 190 against the structure supported on substrate 100, as indicated by the arrow with the circled number "1", and by applying heat so that photoresist disks 194 and 196 slightly soften to allow a thermal bond to be created. These operations must be performed carefully to prevent disks 194 and 196 from flowing or otherwise wetting side surfaces of regions 150 and 152, which could occur with too much heat. Then, as indicated by the arrow with the circled number "2", support film 192 is peeled away, leaving disks 194 and 196 bonded in position. Disks 194 and 196 are therefore examples of non-plateable structures, each of which covers the upper surface of a mold and has a non-plateable lower surface.

Figure 6:
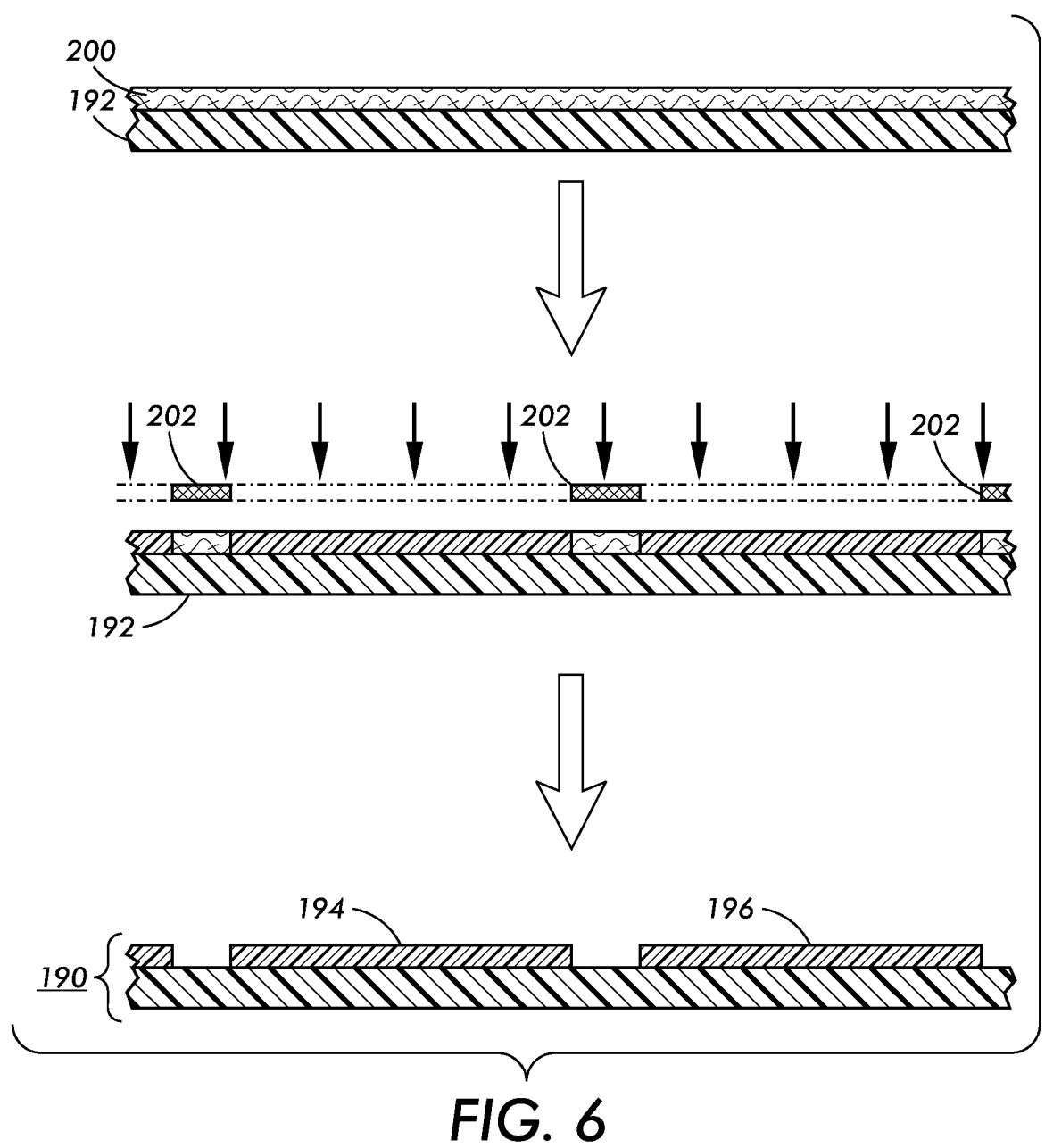
FIG. 6 is a series of cross-sectional views showing stages in producing a patterned laminate as in FIG. 5.

FIG. 6 shows three stages in producing patterned laminate 190 according to a technique that is scaleable to large areas. In the first stage, shown at the top of FIG. 6, support film 192 has deposited on it a photopolymerizable layer 200. Layer 200 could, for example, be a negative dry-film photoresist such as Riston® resist on a polymer substrate as available from E. I. du Pont de Nemours and Company, a 5-50 micron thick layer or other thin layer of dry-film SU-8 coated onto a sheet of Mylar® film, or any other suitable photopolymer. Support film 192 could, as noted above, be Mylar® film or another polyester, but could more generally be any material that can support layer 200, but with sufficiently weak adhesion that film 192 can later be delaminated. Therefore, support film 192 could be any coated or surface treated flexible material in which the coating or surface treatment provides weak adhesion. If support film 192 is a transparent film material, that would be advantageous for alignment of structures. Flexibility is desirable so that support film 192 can be more easily peeled off at a later process stage.

In the second stage, shown in the center of FIG. 6, an ultraviolet (UV) light photomask 202 is positioned over layer 200, and UV light is then directed through the mask onto exposed areas of layer 200. Development and removal of unexposed areas then produces the third stage shown at the bottom of FIG. 6, which is the same as patterned laminate 190 in FIG. 5.

As described above, patterned laminate 190 has disks 194 and 196, but any other appropriate shape or pattern could be used to cover top surfaces of regions 150 and 152 and provide overhanging structures while allowing plating solution to reach side surfaces of regions 150 and 152. As mentioned below, the plating molds and plated structures could have various other shapes, in which case the covering and overhanging structures would also have other shapes, though not necessarily the same shapes as the plating molds they cover.

In general, the extent of overhang can equal or exceed the plating thickness to prevent top surface protrusions, can vary along the edge of a plating mold, and can be sufficiently great to allow for some error in alignment. Furthermore, an overhanging structure need not be planar as in FIGS. 5 and 6, but could instead be curved or have a more complex shape to produce more complex limit artifacts; for example, disks 194 and 196 could each have an additional non-plateable annular part hanging down at the perimeter of the lower surface, to produce a stepped plated surface, as described in greater detail below in relation to FIG. 14. Also, various other patterning techniques could be used, including embossing, dry etching, laser ablation, or other techniques that do not require a photosensitive layer but can use any other suitable non-plateable material. It may also be possible to photolithographically pattern a dry film resist layer after it is bonded over regions 150 and 152 rather than before.

Figure 7:
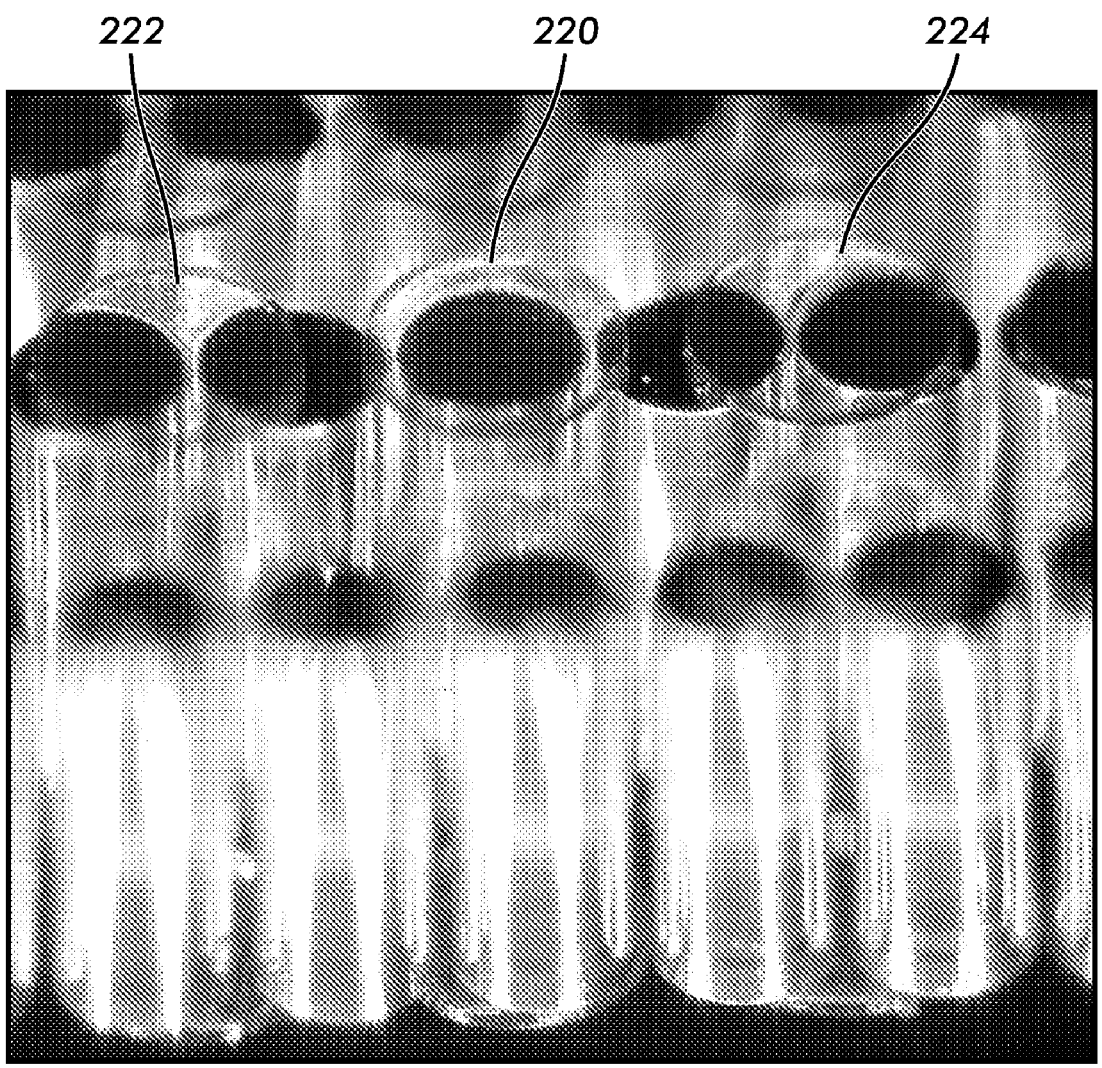
FIG. 7 is a photographic image of cylinders with a seed layer and with disks similar to the cylindrical region in FIG. 5.

FIG. 7 shows an image of an array of cylinders similar to cylindrical region 152, over which a gold seed layer similar to seed layer 170 has been sputter coated, making the side surfaces of the cylinders highly reflective. Then, photoresist disks similar to disk 196 have been bonded to the upper surfaces of the cylinders. Disk 220 is aligned over a cylinder and therefore overhangs and extends beyond the entire edge between the cylinder's upper surface and side surface. Disks 222 and 224, on the other hand, are not aligned with a single cylinder, but rather rest on neighboring cylinders, only partially covering the upper surface of each cylinder and therefore overhanging and extending beyond only a part of each cylinder's edge.

Figure 8:
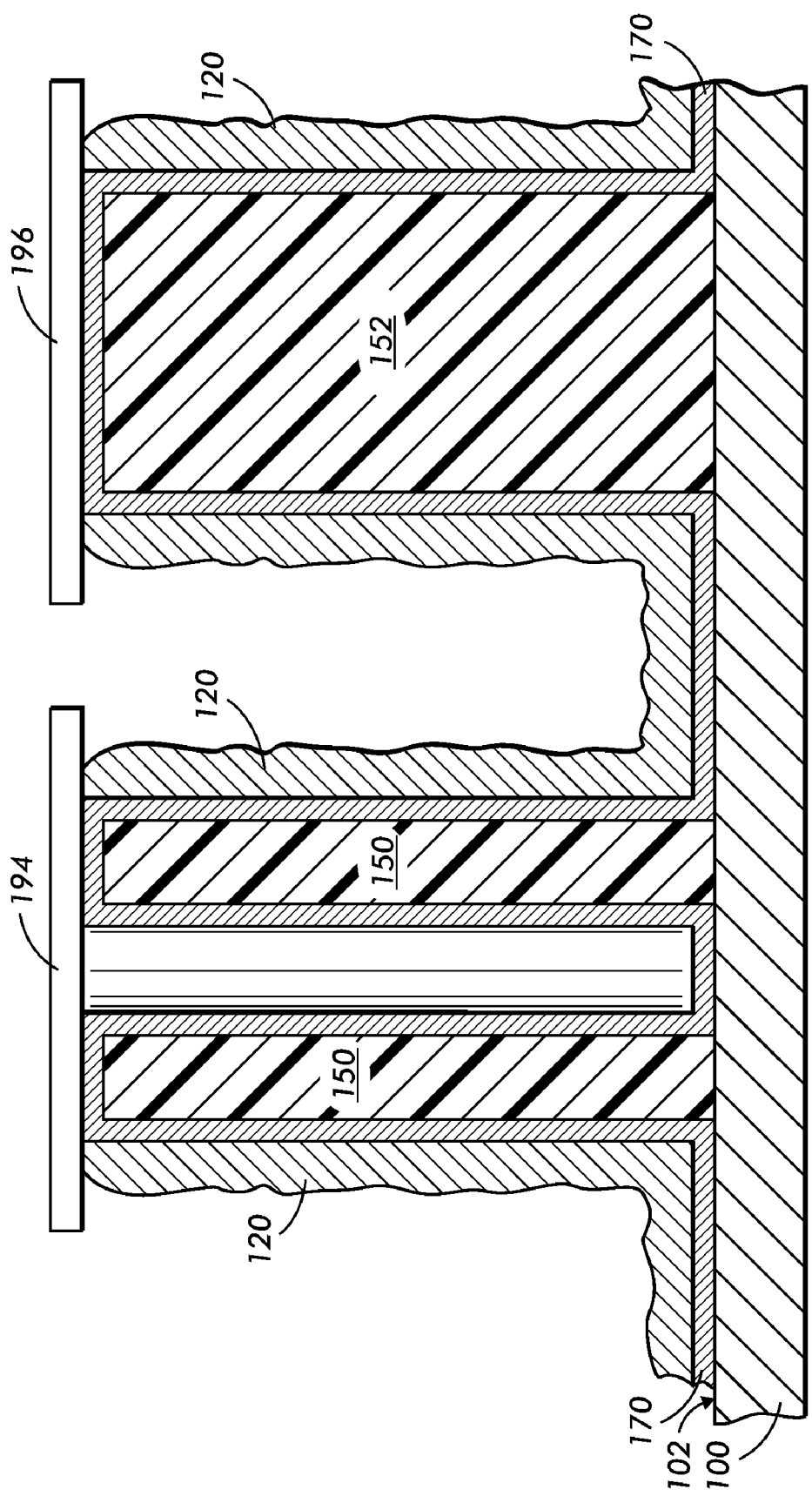
FIG. 8 is a cross-sectional view of a stage following the stage in FIG. 5, after plating.

FIG. 8 shows a stage following that in FIG. 5 in which plated structure 120 has been formed using regions 150 and 152 as molds by depositing material on exposed portions of seed layer 170 but not on non-plateable surfaces. For example, plated structure 120 could be nickel, gold, copper, or layers of plated materials, electroplated or electrolessly plated laterally to a thickness of microns or tens of microns, or, more specifically, in the range 1-50 microns. The plated materials could also include magnetic materials, such as NiFe, CoNi, FeCo, and so forth, or the plated materials could include solder materials such as PbSn, BiSn, Indium or AU/SN. Furthermore, hydrophobic coating can be deposited such as by plating HiFLON® material (from Uemura Hikifune, Co., Ltd.); such coatings also have other properties such as low friction and anti-abrasion.

An advantage of plating directly on side surfaces of regions 150 and 152 or other plating molds is relatively short plating time. A 10 micron thick layer may take only 30 minutes to electroplate, while about 20 hours would be required to deposit a 600 micron tall structure by plating upward from surface 102 of substrate 100.

As discussed above in relation to FIG. 1, the top ends or lips of structures plated around tubular region 150 and cylindrical region 152 will have limit artifacts resulting from the non-plateable lower surfaces of disks 194 and 196. FIG. 8 shows curved surfaces similar to surface 122 in FIG. 1 and, adjacent to disks 194 and 196, smooth upper surfaces similar to surface 124 in FIG. 1. As in FIG. 1, each curved surface provides a transition between a smooth upper surface and an irregular side surface.

FIG. 8 illustrates microstructures, each including a body with a base end and a plated part. The base ends illustratively support the microstructures on surface 102, and the plated parts are in plated structure 120. Plated structure 120 has limit artifacts that are not disposed toward the base end, but rather away from it.

The structure shown in FIG. 8 could be processed in various ways for different applications. In general, structures produced in the above manner may be advantageous in applications where the geometry or other surface characteristics of microstructures at ends disposed away from substrate 100 play an important role. In some applications, disks 194 and 196 or other overhanging structures can be removed so that other top structures can be positioned on the top ends, or can be left in place when a top structure is added over them. The smooth upper surfaces of the top ends may, for example, allow bonding to a top structure without further processing (such as polishing). In other applications, the geometry or other surface characteristics of top ends of microstructures can help produce a desired interaction with fluid.

Figure 9:
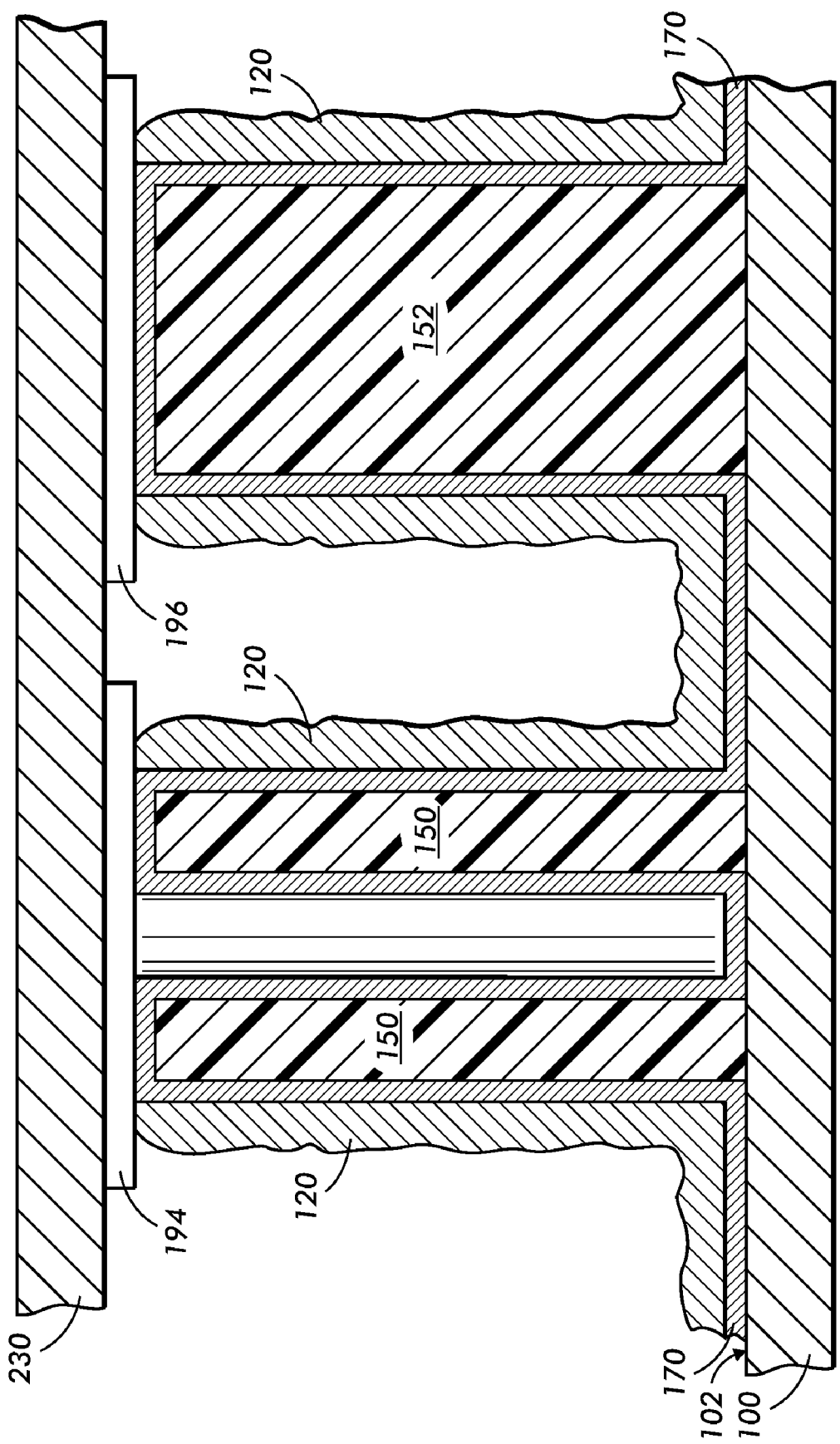
FIG. 9 is a cross-sectional view of a stage following the stage in FIG. 8.

FIG. 9 shows an example in which second substrate 230 is bonded to the upper surfaces of disks 194 and 196. If the photopolymer material of disks 194 and 196 is still capable of forming a thermal compression bond, it could act as the adhesive for this bond. Various other techniques could be used to form a bond between substrate 230 and disks 194 and 196. Also, substrate 230 could have alignment features on its lower surface, such as bumps or rings of SU-8 or other resist material, patterned to facilitate alignment with disks 194 and 196. In this case, bonding could be obtained by melting solder layers previously deposited over the alignment features and over plated structure 120. Furthermore, material could be plated over the alignment features to assist alignment or bonding by making contact with plated structure 120.

Once second substrate 230 is bonded, further processing could be performed; for example, if second substrate 230 has an aperture over disk 194, an opening could be etched through disk 194 to access the opening under it. An issue with microstructures as in FIG. 9, however, is potential delamination between plated metal and SU-8 due to difference in coefficient of thermal expansion.

Figure 10:
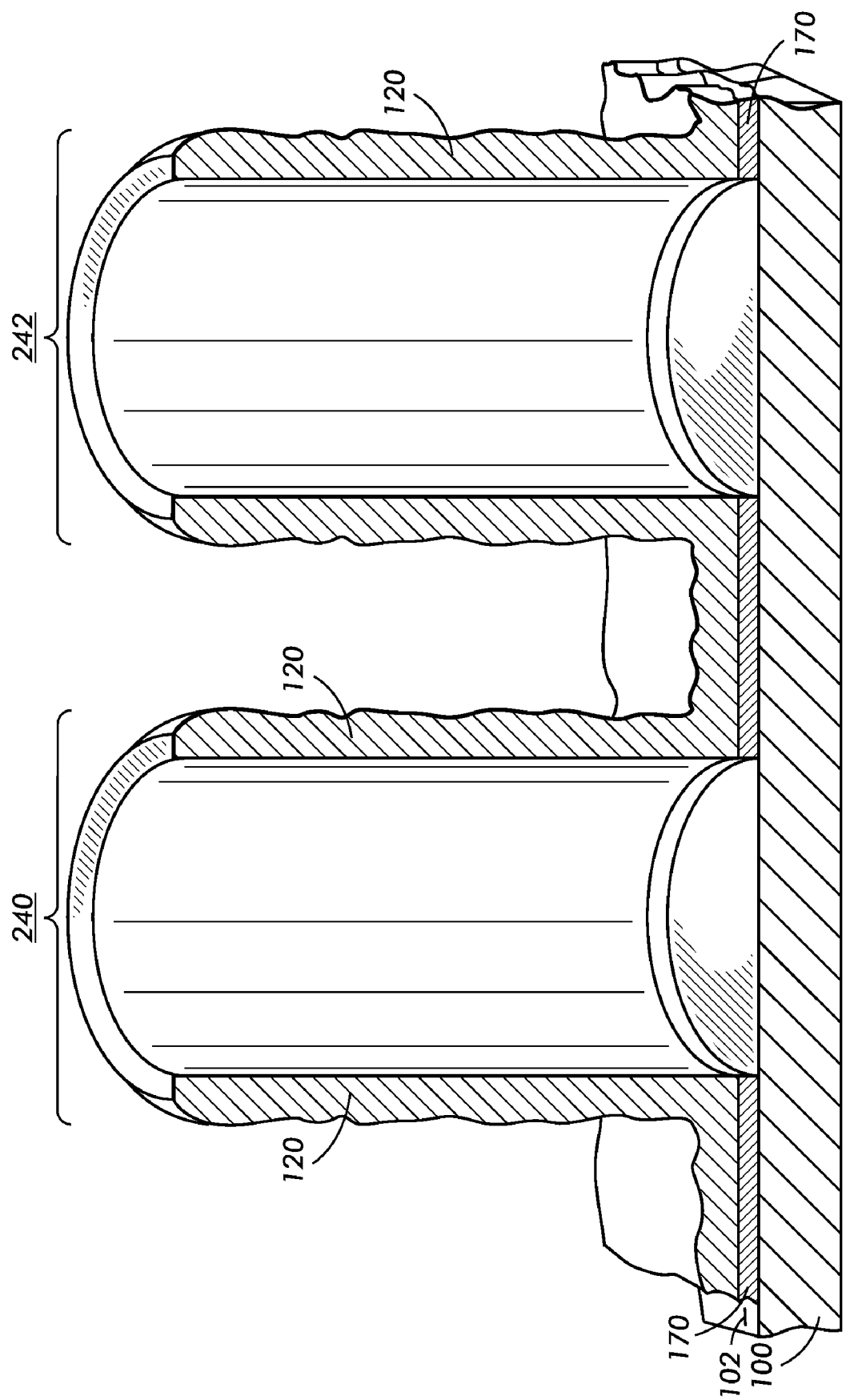
FIG. 10 is a cross-sectional view with upper surface perspective of another stage following the stage in FIG. 8.
Figure 22:
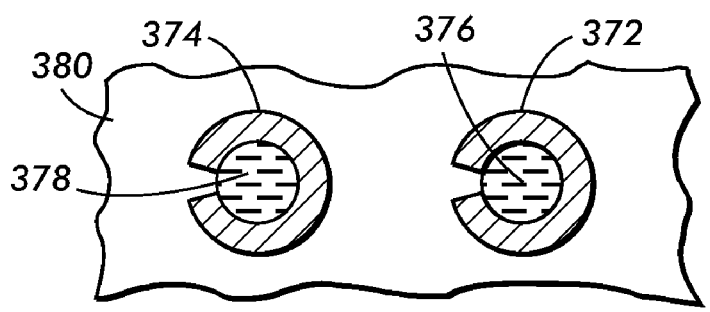
FIG. 22 is a cross-sectional view of a modification of the plated microstructures in FIG. 21, taken along the line 22-22.
Figure 23:
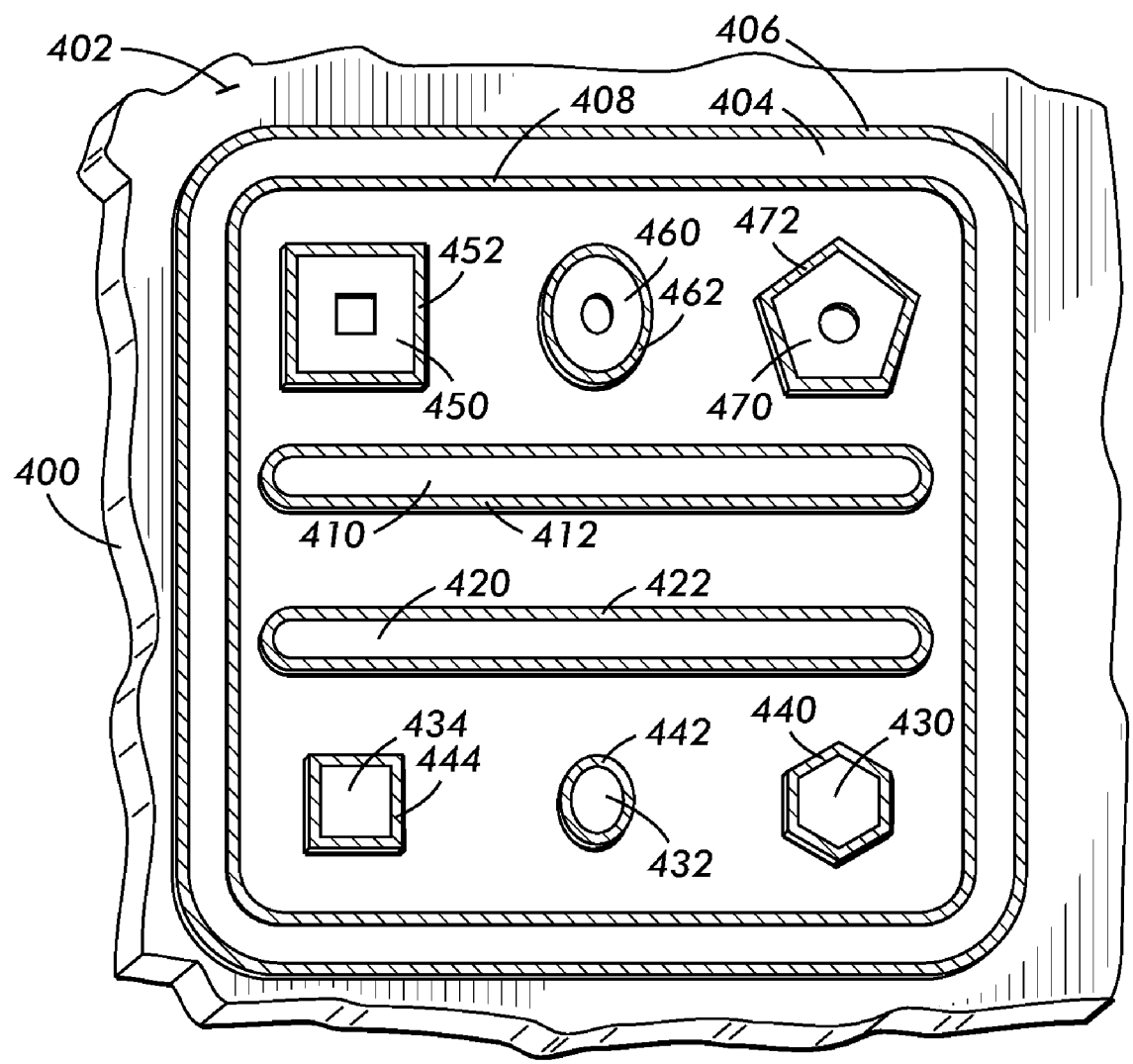
FIG. 23 is a top view of a number of plated structures on a substrate.

FIG. 10 shows another stage that could follow that of FIG. 8. In this stage, various portions of the structure shown in FIG. 8 have been removed, leaving tubular microstructures 240 and 242, also referred to herein as "microtubes." Microtubes 240 and 242 have flat, smooth top end surfaces, limit artifacts that facilitate bonding as discussed in relation to FIG. 13 below. More generally, microstructures 240 and 242 are each examples of "tube-shaped" structures, used herein to mean a tube or other structure that has a length such that any cross-section along its length includes a wall around a cavity, and the cavities of the cross-sections are substantially uniform in size and shape. In addition to circular microtubes with circular cavities, tube-shaped structures could be oval, rectangular, polygonal, or irregularly shaped and could have oval, rectangular, polygonal, or irregularly shaped cavities; some examples are illustrated in FIG. 23, below. Also, tube-shaped structures include structures in which the walls do not extend completely around the cavity, examples of which are described below in relation to FIG. 22.

Microstructures 240 and 242 are also examples with tube-shaped bodies that have openings at their top ends. More specifically, each is a tube with a circular top end. The lip around the entire top end has no protrusions, an example of a limit artifact. As a result, the lip has a smooth surface and a curved surface as in FIG. 1. The plated structure 120 extends nearly the full length from the base end on surface 102 to the smooth top surface.

Plated structure 120 also provides a wall or wall-like structure. As used herein, "wall" means an element or component with opposite surfaces that are approximately parallel and with length and width that are both greater than thickness between the opposite surfaces. As used herein, a "wall-like" body or other structure is either a wall or a structure similar to a wall that does not fit the above definition of a wall because of a minor difference, such as that its thickness in places exceeds either its length or its width, or that, due to openings, gaps, or irregularities of some other sort, its length or width in places is less than its thickness.

FIG. 10 also illustrates an example of apparatus with a lower structure having a support surface and an upper structure on the support surface, in addition to a top structure on the upper structure. Substrate 100 exemplifies the lower structure, with surface 102 serving as the support surface. Plated structure 120 exemplifies the upper structure, and further has plated surface with a limit artifact disposed away from the support surface. The top structure is supported on the plated surface. In addition, each microstructure in FIG. 10 has a wall-like body that surrounds a cavity, and the microstructures are of substantially equal length.

Figure 11:
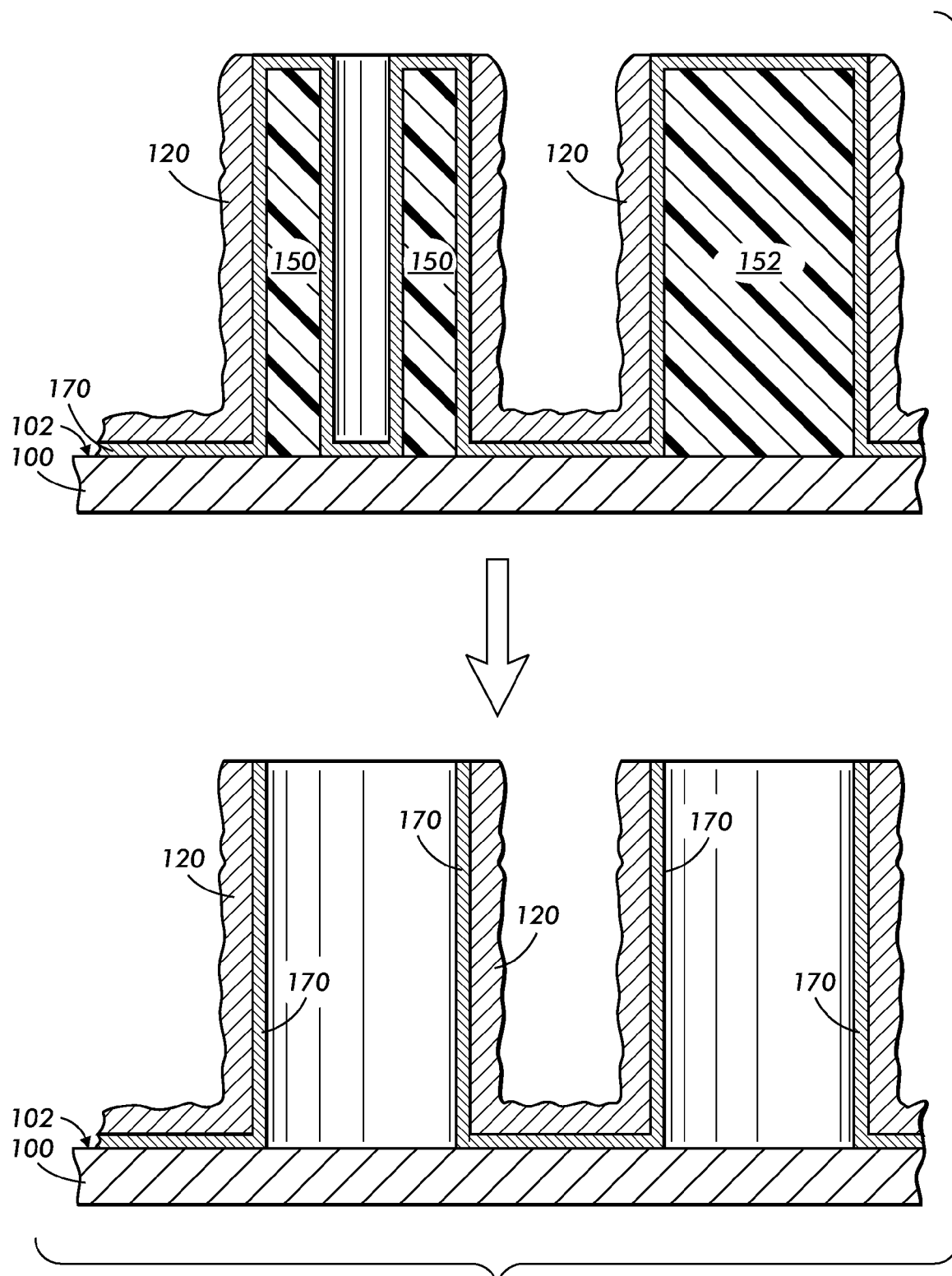
FIG. 11 shows two intermediate stages by which the microtubes in FIG. 10 could be produced from the stage in FIG. 8.

FIG. 11 illustrates intermediate stages in producing the structure shown in FIG. 10 from that in FIG. 8. Each intermediate stage could, however, have a top structure attached to it rather than being further processed to obtain the structure in FIG. 10. In microfluidic applications, for example, an inner surface appropriate to specific fluids can be chosen in this way.

In the stage shown in the upper part of FIG. 11, photoresist disks 194 and 196 have been removed from the structure in FIG. 8, leaving exposed the seed layer 170 on regions 150 and 152. If disks 194 and 196 are Riston® resist, for example, they can be removed by a solvent; other materials may require dry etching such as plasma etching.

In the lower part of FIG. 11, exposed portions of seed layer 170 have been removed from upper surfaces of regions 150 and 152, and then regions 150 and 152 have similarly been removed, leaving microstructures very similar to those in FIG. 10, but with an inner remnant of seed layer 170. This inner seed layer 170 can then be removed to obtain the structure in FIG. 10 with microtubes 240 and 242. In general, exposed seed layer 170 can be removed by suitable wet or dry etching. If regions 150 and 152 are SU-8, they can be removed with dry etching techniques such as from Matrix Integrated Systems, Inc., wet etching techniques such as those that are available from SOTEC Microsystems, plasma systems, n-methylpyrrolidone, or commercially available SU-8 strippers; it may also be possible to burn SU-8 at around 500° C. in an oxygen-rich environment. Because of its thin walls and greater surface area, region 150 may be more easily removed than region 152, by any of these techniques.

Figure 12:
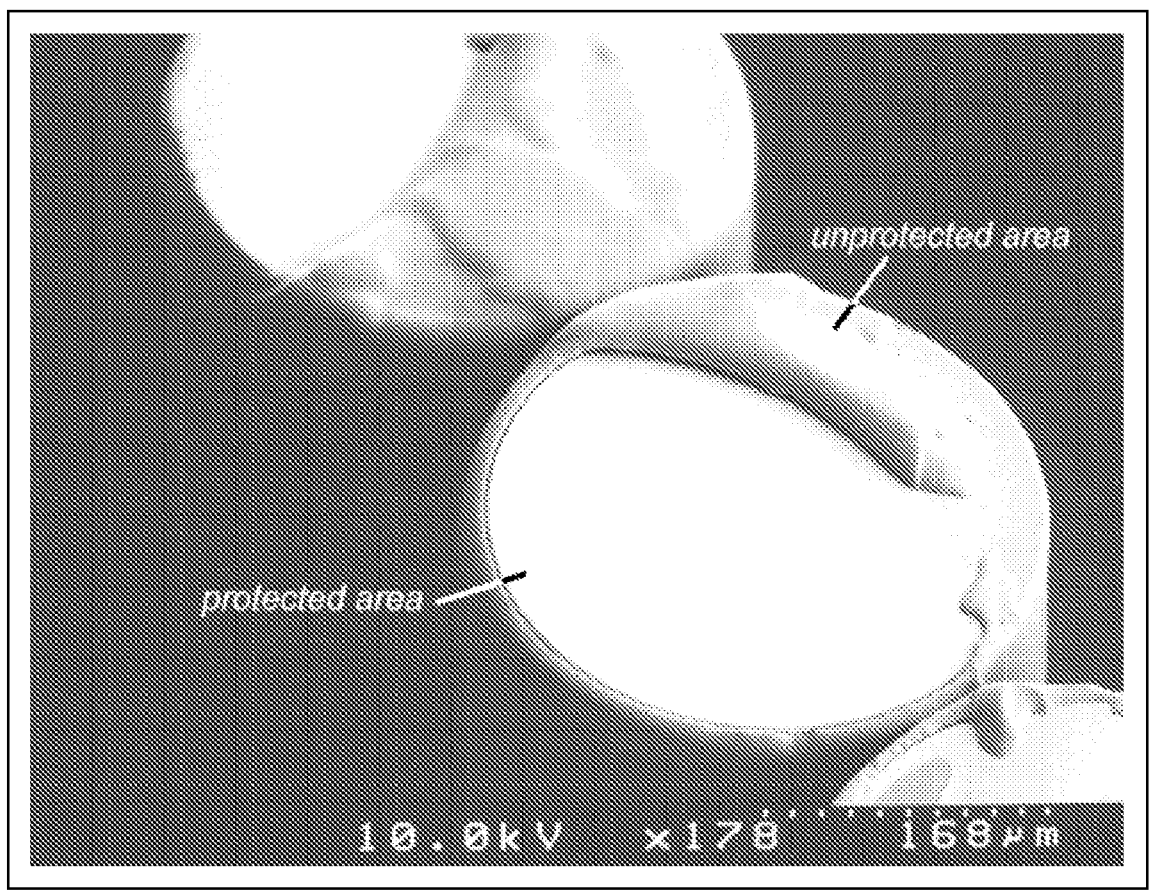
FIG. 12 is a photographic image of upper surfaces of cylindrical regions that, during plating, were partially covered by misaligned disks as shown in FIG. 7 and from which the disks were then removed as in the upper stage in FIG. 11.

FIG. 12 shows photographically the appearance of cylinders with misaligned disks as shown in FIG. 7 after removal of the disks as in the upper part of FIG. 11. In the central portion of FIG. 12, the flat area on a cylinder is exposed SU-8 photoresist that was protected by the presence of a disk, while the rugged area on the upper right of the same cylinder was not protected and therefore was plated with nickel in this example. If a process as in FIG. 11 were performed, the resist from the protected area and from under the plated nickel would be removed, leaving the plated nickel partially covering the top end of the plated tube. FIG. 12 also illustrates the smooth and curved surfaces at the top end or lip of a plated microstructure as discussed above in relation to FIG. 1. In the example shown, nickel was plated to a thickness of about 10 microns.

FIG. 12 also suggests how a microfluidic ducting structure could be made by removing the SU-8 material inside the plated structure. Fluid could flow through the central opening or duct of the plated structure, and out through the part of the upper opening that is not covered by plated material. The limit artifact would only extend around part of the opening, while the plated material without a limit artifact would cover the rest of the opening.

Figure 13:
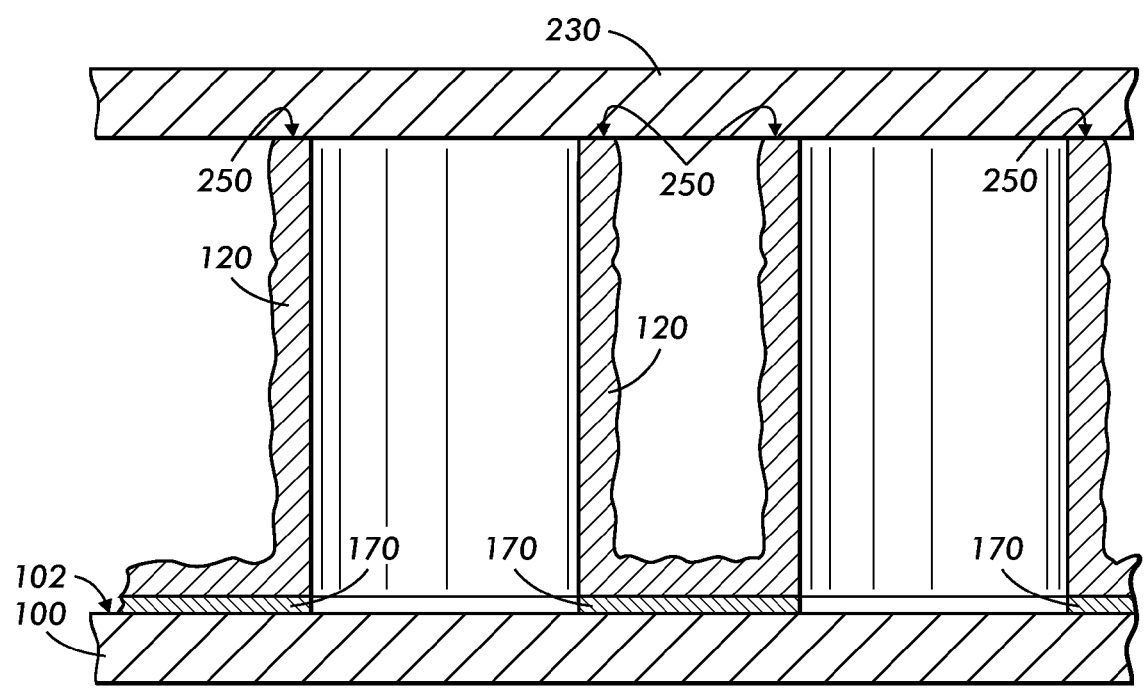
FIG. 13 is a cross-sectional view of a stage following the stage in FIG. 10.

FIG. 13 shows a structure produced by bonding second substrate 230 onto the top ends of microtubes 240 and 242 in FIG. 10. Because the top ends or lips on microtubes 240 and 242 have flat, smooth upper surfaces, a thin layer of solder on each bonding surface 250 may be sufficient to secure second substrate 230 in position. Various other techniques could be used to provide a sufficient bond at bonding surfaces 250, including an adhesive, eutectic bonding, or, if gold plated structures, diffusion bonding. In addition, second substrate 230 could instead be bonded to the upper surface of either of the intermediate stages shown in FIG. 11, depending on the specific application and the desired characteristics of the microstructures.

As discussed in relation to FIG. 19, below, a structure like that in FIG. 13 could, with suitable openings in substrates 100 and 230, serve as a microfluidic structure, and specifically a microfluidic interconnect. The microtubes defined in plated structure 120 can serve as ducting structures, each with an opening disposed away from substrate 100 and a limit artifact extending around the entire opening. In effect, each microtube also has an opening disposed toward substrate 100 through which fluid can flow.

Figure 14:
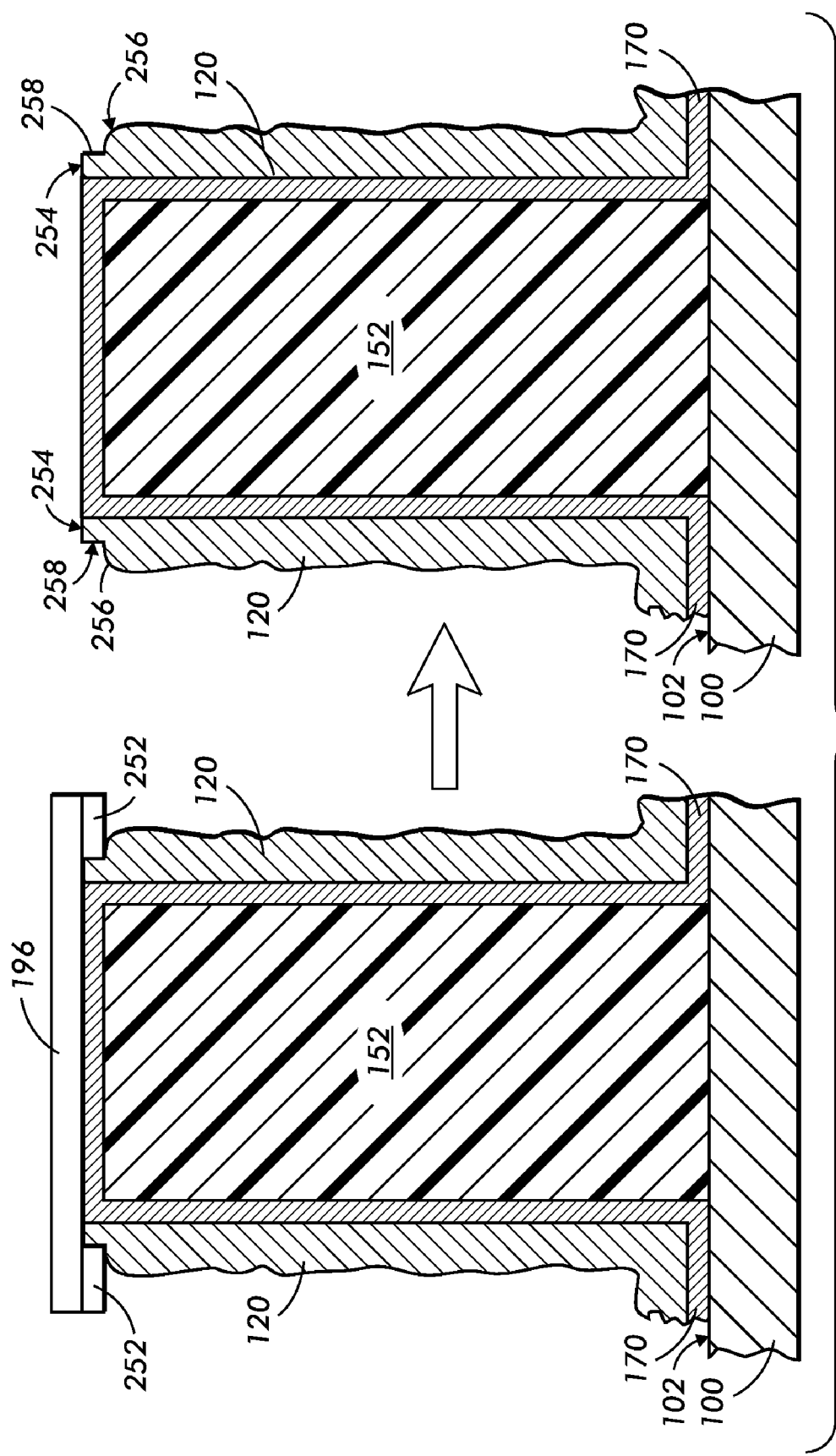
FIG. 14 shows cross-sectional views of two stages of a technique similar to that in FIGS. 8 and 11, but with a differently shaped overhanging structure.

FIG. 14 shows two stages in a variation of the technique in FIGS. 8 and 11. The technique in FIG. 14 produces another type of limit artifact useful in producing a structure similar to that in FIG. 13.

The left cross-section in FIG. 14 shows region 152, a mold on surface 102 of substrate 100. Seed layer 170 is over region 152, and non-plateable disk 196 is on the upper surface of region 152. Attached to the lower surface of disk 196 is a non-plateable annular extension 252, which could be a separately fabricated piece attached to disk 196 or could be formed integrally with disk 196. As in FIG. 8, plated structure 120 has been formed using region 152 as a mold by depositing material on exposed portions of seed layer 170 but not on non-plateable surfaces.

The right cross-section in FIG. 14 shows the result after removal of disk 196 and extension 252. In this view, the top ends or lips of plated structure 120 have limit artifacts resulting from the non-plateable lower surface of disk 196 and the non-plateable inner and lower surfaces of extension 252. Smooth upper surface 254 is similar to surface 124 in FIG. 1, and curved surface 256 is similar to curved surface 122 in FIG. 1. Between them is L-shaped step 258, which follows the shape of extension 252, with the vertical part following the inner surface of extension 252 and the horizontal part following the lower surface of extension 252. Curved surface 256 therefore provides a transition between the horizontal part step 258 and an irregular side surface.

A top structure can be positioned on the top end of plated structure 120, such as after removal of region 152 as shown in FIG. 13. The top structure can have an opening or indentation that fits over the top end of plated structure 120, so that step 258 acts as a socket, providing appropriate alignment of the top structure and better bonding. Furthermore, if several similar plated structures are on substrate 100, the combination of limit artifacts also allows for tolerances if the structures have slightly different lengths. These features would not be achievable through polishing or other conventional techniques.

Figure 15:
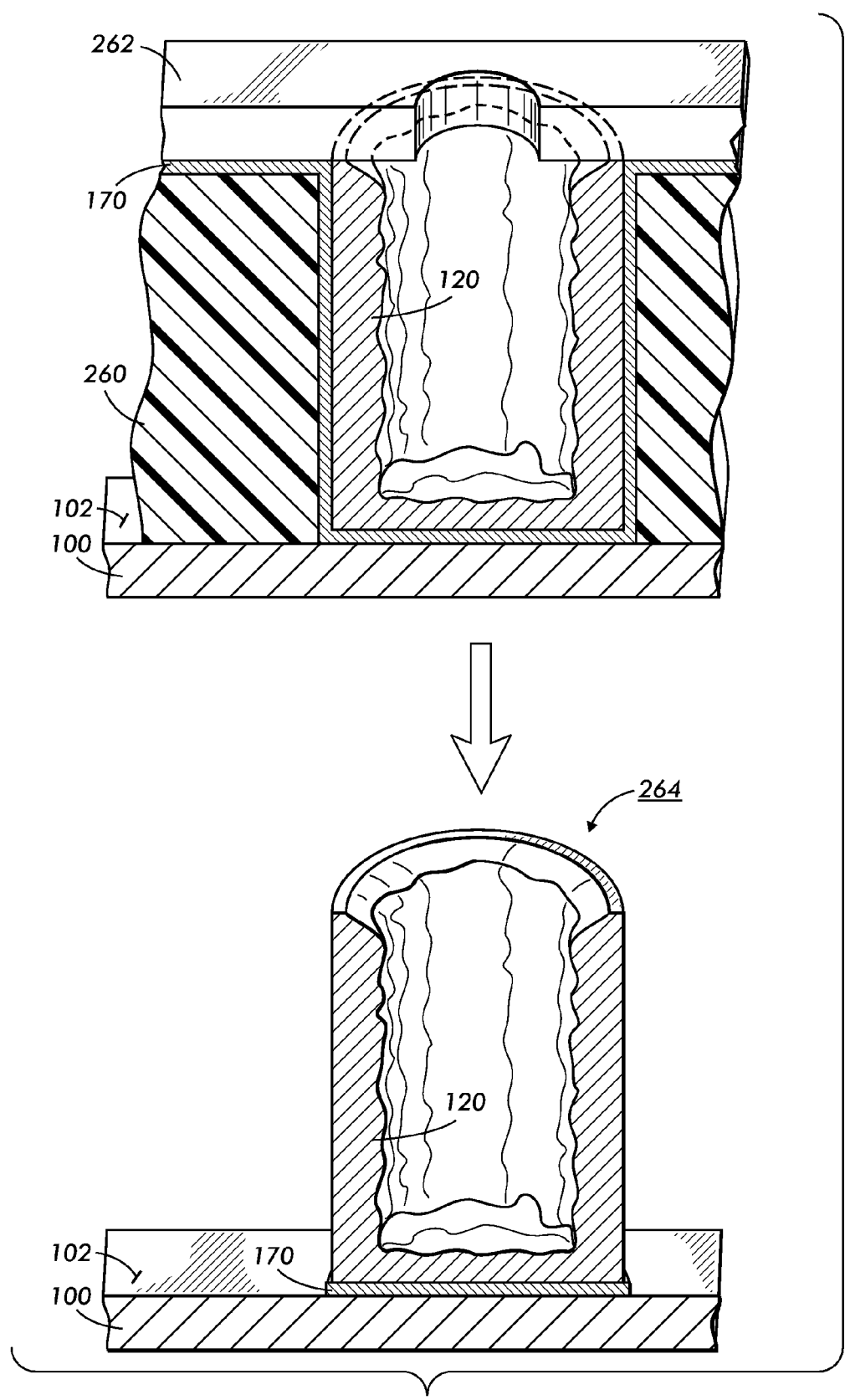
FIG. 15 shows cross-sectional views with upper surface perspective of two stages of a process by which a plated, cup-shaped microstructure is produced.

FIG. 15 shows stages in producing a differently shaped microstructure with a process very similar to that illustrated in FIGS. 3, 5, 8 and 10. As in FIG. 2, resist layer 260 is photolithographically patterned, but in this case to form an opening rather than tubes or cylinders. Then, seed layer 170 is deposited, such as by sputter coating, and resist layer 262 is provided, such as with a patterned laminate as in FIG. 5. As shown, layer 262 has an opening defined over the opening in layer 260, but with a smaller diameter, so that resist layer 262 overhangs the edges around the opening in resist layer 260. Plated structure 120 therefore forms on the internal surface of the opening in resist layer 260. After removal of resist layer 262, exposed portions of seed layer 170, and resist layer 260, microstructure 264 remains, as shown in the lower part of FIG. 15.

Microstructure 264 has a smooth top surface, a curved transition surface and then an irregular side surface. For illustrative purposes, these surface portions are separated by lines that are emphasized in FIG. 15, although the lines would not be visible in an actual implementation. As discussed above, the smooth and curved surfaces are limit artifacts.

Various other shapes for plating molds and plated structures could be produced using substantially the same techniques described above, but with different masks during patterning of resist layers. For example, rather than circular structures or openings as in the above illustrations, the openings or structures could be oval, square, rectangular, or with any other polygonal shape. Also, rather than being a complete tube, cylinder, cup, or other closed structure, a semicircular or otherwise incomplete structure could be formed. In addition, extended structures or openings could be formed in the nature of straight or meandering walls or channels. Some examples of other shapes are described below in relation to FIG. 23.

Figure 16:
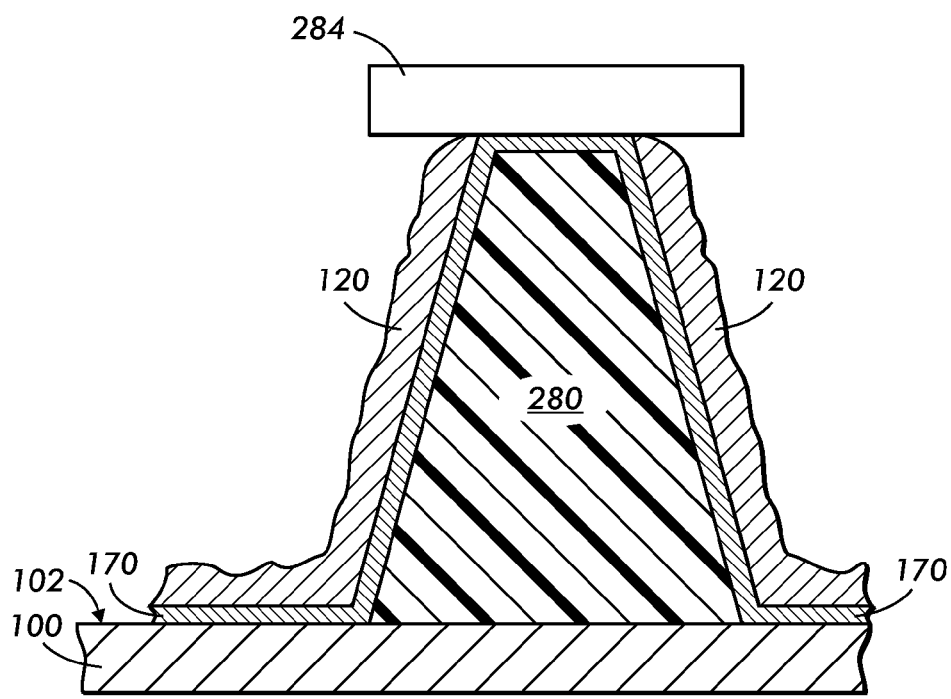
FIG. 16 shows a cross-sectional view of a stage in producing a plated structure using a mold with converging oblique side surfaces.
Figure 17:
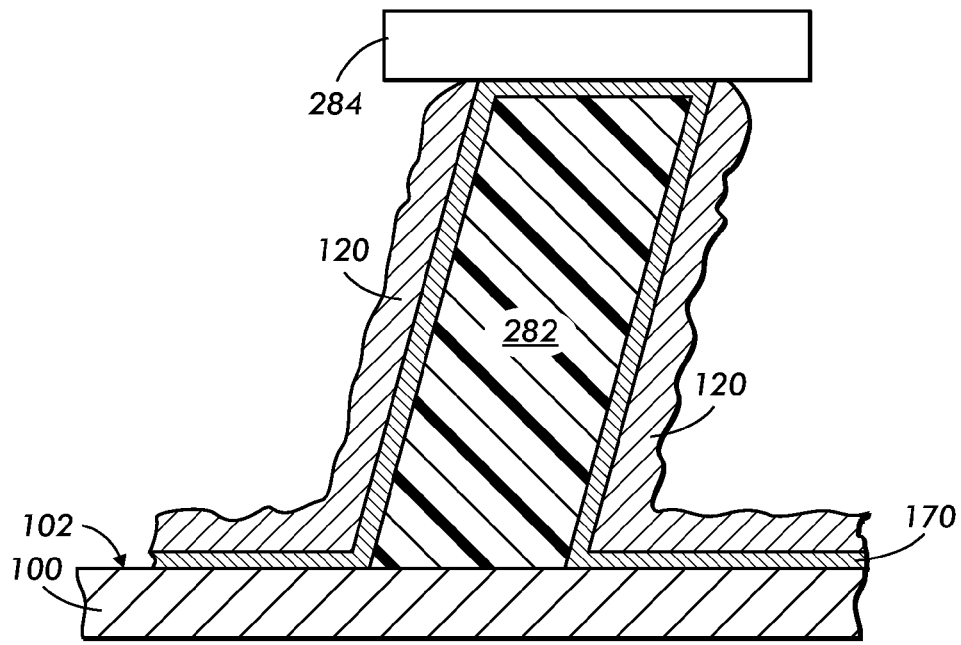
FIG. 17 shows a cross-sectional view of a stage in producing a plated structure using a mold with parallel oblique side surfaces.

Similarly, rather than providing structures that are perpendicular to the surface of an underlying substrate, as described above, structures with oblique surfaces could be produced. FIGS. 16 and 17 illustrate two examples of structures with oblique side surfaces and overhanging resist portions. In FIG. 16, mold 280 has converging oblique side surfaces, and could be conical or could extend laterally as a tapered wall, for example. In FIG. 17, mold 282 has substantially parallel oblique side surfaces, and could similarly be a leaning cylinder or wall. In both cases, an overhanging resist layer 284 extends beyond the edge of the upper surface of the underlying mold.

Structures with oblique walls as in FIGS. 16 and 17 could be produced in various ways, including those described in Han, M. H., Lee, W. S., Lee, S. -K., and Lee, S. S., "Fabrication of 3D Microstructures with Single uv Lithography Step," *J. of Semiconductor Technology and Science*, Vol. 2, No. 4, December, 2002, pp. 268-272 and in co-pending U.S. patent application Ser. No. 10/974,933, both of which are incorporated herein by reference.

Figure 18:
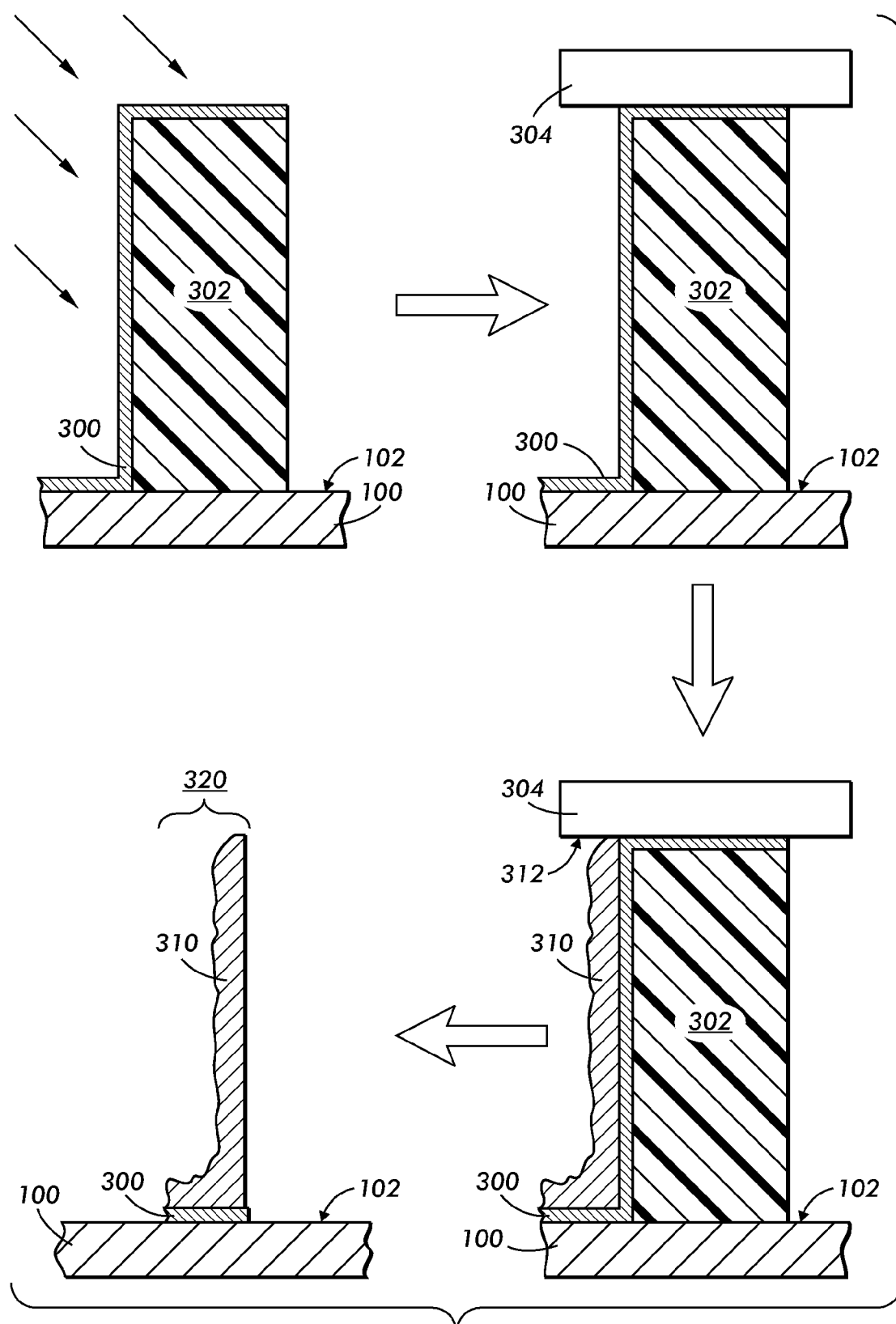
FIG. 18 shows cross-sectional views of four stages of a process by which a plated, L-shaped microstructure is produced on one side of a mold.

FIG. 18 shows a sequence of stages in producing structures using partial plating of a side surface with a seed layer. In the first stage in FIG. 18, seed layer 300 is produced by oblique evaporation of an appropriate metal onto mold 302. Then, as shown in the second stage in FIG. 18, an overhanging resist layer 304 is positioned on top of mold 302. In the third stage shown in FIG. 18, plated structure 310 is produced on exposed portions of seed layer 300, with the lower surface 312 of overhanging resist layer 304 preventing protrusions from the top end of plated structure 310. Finally, in the fourth stage, operations like those described above in relation to FIG. 11 can be performed in order to remove resist layer 304, exposed portions of seed layer 300, and, finally, mold 302, leaving L-shaped structure 320.

As with other implementations, the structures in FIGS. 16-18 each include a body with a base and a plated part. In each case, the plated part has a limit artifact disposed away from the base. The limit artifacts include smooth upper surfaces without protrusions and also include curved transition surfaces between the smooth surfaces and irregular side surfaces.

Structures like those described above have a wide range of applications. The following-described applications are exemplary and illustrate features of such structures that could be employed in various other applications involving, for example, microfluidics.

Figure 19:
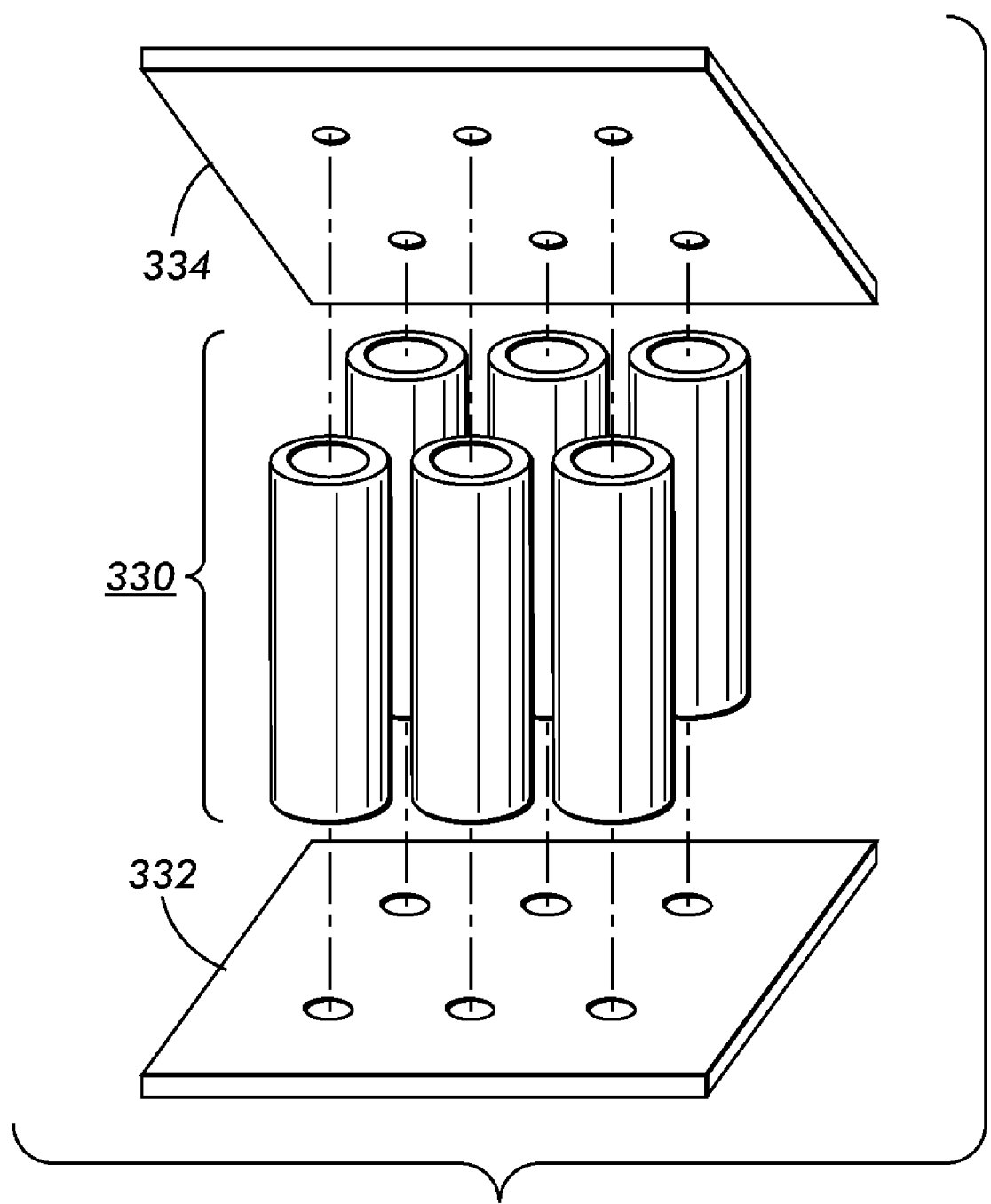
FIG. 19 is an exploded perspective view of parts of a microfluidic interconnect produced as described in relation to FIG. 13.

FIG. 19 shows an exploded view of a microfluidic interconnect structure that could be produced as described above in relation to FIG. 13. Initially, an array of microtubes 330 can be concurrently fabricated on substrate 332, with substantially equal lengths. Then, a second substrate 334 can be bonded on the top ends of microtubes 330. Substrates 332 and 334 can each have apertures or other openings formed before or after other processes, with each microtube in array 330 being aligned with a respective aperture or opening in substrate 332 and with a respective aperture or opening in substrate 334. One end of the microtube could be an inlet opening for receiving ink or another appropriate fluid, and the other could be an outlet opening.

Microfluidic interconnect structures similar to that shown in FIG. 19 could be used in various applications. For example, a similar structure could be used as a printhead in an ink-ejecting printer, as described in co-pending, co-assigned U.S. patent application Ser. No. 11/014,356, incorporated herein by reference. In this case, substrates 332 and 334 could each be an assembly of stainless steel plates with apertures and/or with embedded ducts or channels rather than through-holes. The dimensions of the microtubes in array 330 could be appropriate for the ink ejection technique employed. For example, the microtubes in array 330 could be about 200-300 microns in diameter, and the output apertures could have a density of 600 nozzles per square inch. Each tube in array 300 could be about 600 microns tall.

It is expected that a microfluidic interconnect structure with metal plated tubes such as nickel or gold, with or without tubular polymer molds inside them, would resist degradation and maintain adhesion. Also, stress should not be a problem because of small differences in thermal expansion coefficients between the metal tubes and the stainless steel substrates. On the other hand, plated metal microtubes conventionally require chemical mechanical polishing (CMP) or other planarization to remove over-plated material from top surfaces of plating molds and provide a flat, smooth top surface for bonding. In addition to requiring a costly, slow additional step, CMP may break off or damage microtubes, decreasing yield.

If microtubes in array 330 are instead plated as described in relation to FIG. 8, such as to a thickness of microns or tens of microns, they would have the reduced degradation and improved adhesion of other plated metal microtubes. In addition, if steel substrate 334 is attached as in FIG. 13, because of the smooth surfaces at the top ends or lips of the microtubes in array 330, there would be no requirement for CMP, reducing manufacturing costs and time and increasing yield by avoiding the destructive effects of CMP. Similarly, CMP would also be unnecessary if steel substrate 334 is attached as at left in FIG. 9, though this may be problematic due to the presence of disk 194.

It may also be possible to employ the technique illustrated in FIG. 12 to produce microtubes with one end partially covered by plated material. If array 330 included microtubes of this type, the plated material partially covering the top end could act as a spacer when substrate 334 is attached, permitting fluid flow in or out of each microtube through the uncovered part of its top end. For example, ink or marking fluid could flow from a plenum between substrates 332 and 334 through the uncovered part of a microtube's top end and into the microtube's central cavity or duct; from the microtube's lower end opening, droplets could be ejected through an aperture in substrate 332.

Figure 20:
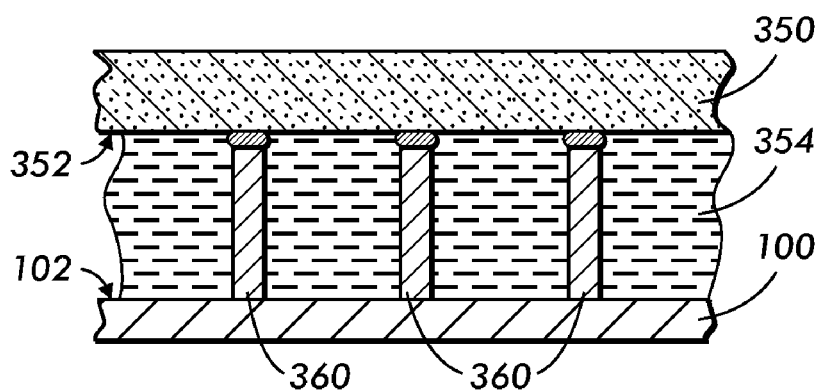
FIG. 20 is a cross-sectional view of another microfluidic application of plated structures with a top structure attached, similar to the stages shown in FIGS. 9 and 13.

FIG. 20 illustrates another microfluidic application in which a second structure is bonded to the top ends or lips disposed away from the substrate upon which wall-like structures are formed such as by the techniques illustrated above in relation to FIGS. 16-18. Bonding could be performed as in FIG. 9. In this application, top structure 350 can, for example, be a microchip, in which case liquid 354 in contact with lower surface 352 of top structure 350 can perform a cooling function. Wall-like structures 360 in this application could, for example, be straight or meandering walls that form channels or ducts to guide liquid 354 from an inlet opening to an outlet opening, possibly ensuring that all areas of top structure 350 are adequately cooled. Similar structures could be provided for various other microfluidic applications. Metal walls are advantageous in such applications because of their strength and because they can be bonded to other structures with solder, possibly a very thin layer of solder if the surfaces to be bonded are sufficiently smooth. Smooth top surfaces could be limit artifacts, produced as described above in relation to FIG. 18, for example.

Figure 21:
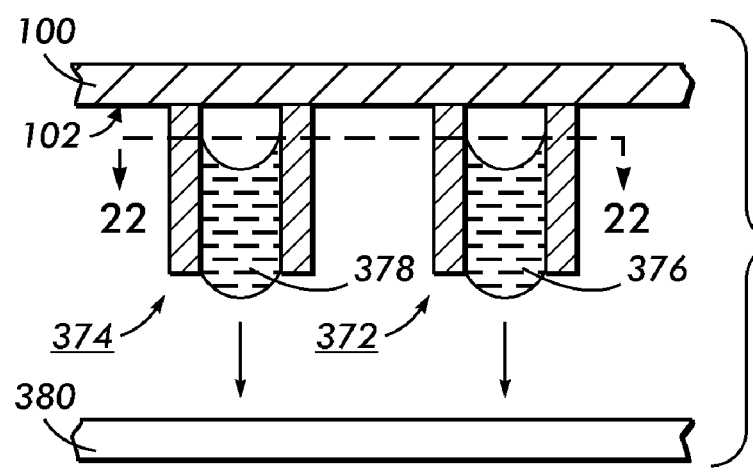
FIG. 21 is a cross-sectional view of another application of plated microstructures like those in FIG. 10 or FIG. 15, suitably modified.

FIG. 21 shows an application in which microstructures like those in FIG. 10 or FIG. 15 could be used if suitably modified. One modification, illustrated in cross-section in FIG. 22, is a vent opening in the side of microstructures 372 and 374 to allow air or gas movement. Microstructures 372 and 374 have been dipped into a liquid, resulting in droplets 376 and 378, respectively, held in microstructures 372 and 374 by surface tension much as ink is held in a quill pen. As the top ends of microstructures 372 and 374 approach surface 380, droplets 376 and 378 contact surface 380 and are transferred to it, after which microstructures 372 and 374 are retracted. In this implementation, a smooth, even surface at the top end or lip of each of microstructures 372 and 374 may assist in permitting reproducible droplet dispensing. In addition, for applications that deposit arrays of biomolecules on surface 380, microstructures 372 and 374 could be coated with hydrophilic or hydrophobic material as appropriate or, more generally, with a coating that is inert with respect to the biomolecules.

It may also be possible to modify the implementation in FIG. 21 so that microstructures 372 and 374 serve as nozzles, with an inlet through substrate 100, avoiding the need for an additional nozzle plate as in the implementation in FIG. 19.

FIG. 23 illustrates various other plated structures that could be produced as described above and that might be useful in various other applications. For illustrative purposes, all the structures are shown together on substrate 400, supported on surface 402. Each structure includes a mold, which can include polymer material such as SU-8, and at least one plated structure on the mold. The plated structures all have limit artifacts due to non-plateable overhanging structures present during plating.

Mold 404 is a closed wall-like structure with plated structures 406 and 408 on its outer and inner sides, respectively. Mold 404 and structures 406 and 408 thus enclose an area of surface 402 that supports the other structures. In printhead or other microfluidic applications, this combination of structures could be useful to form a seal, such as a perimeter seal; a top structure could be mounted on mold 404 and structures 406 and 408 to enclose a volume that can contain fluid. In other applications, this combination of structures could provide a package surrounding and protecting other structures.

Molds 410 and 420 with plated structures 412 and 422, respectively are also wall-like structures, but are not closed. They could similarly have microfluidic functions or could function as spacers or other mechanical components in packaging. In addition, structures like these could extend between and connect to other structures, providing added mechanical stability or affecting fluid flow.

Molds 430, 432, and 434 with respective plated structures 440, 442, and 444 illustrate different shapes that can be plated using the techniques described above. Mold 430 is hexagonal, mold 432 is oval, and mold 434 is rectangular. These combinations could act as spacers, and might also have microfluidic functions. A smooth shape, such as that of plated structure 442, would have different microfluidic properties than shapes like structures 440 and 444.

Mold 450 is also rectangular, but with a rectangular central opening and with plated structure 452 enclosing its outer surface. Mold 460 is oval with an oval central opening and with plated structure 462 enclosing its outer surface. Mold 470 is polygonal, but with a circular central opening, illustrating that the central opening need not have the same shape as the outer surface. Plated structure 472 encloses its outer surface. In addition to applications described above for the structures on molds 430, 432, and 434, these structures with central openings could function, for example, as nozzles or other ducting structures in microfluidic applications.

In addition to their potential applications in microfluidic, packaging, and other mechanical applications, the structures in FIG. 23 might have useful electrical applications. For example, such a structure could act as an electrical conductor between other components, such as between components on surface 402 and on a top structure (not shown). Also, an electric field formed by charge on such a structure could affect nearby charged particles in a fluid.

Techniques as described above could be applied in various other applications, including, for example, microphones or micropumps with membranes over microstructures with plated top ends or lips. More generally, the above techniques may be useful in applications in which microstructures function as spacers or in microfluidic applications. Structures such as in FIGS. 10, 15, 16, and 18 may also be useful as stud bumps for high-density chip-interconnects, as described by Riley, A., "Stud Bumping 300 mm Wafers", published at the FlipChips Dot Com Web site. If made of magnetic or magnetizable materials, such structures could also be used as the yoke structure of a magnet as required in magnetic field sensors or in magnetic write heads. Accurate edges and surfaces are necessary in this application to ensure that the magnetic field lines are not distorted.

Some of the above exemplary implementations involve specific materials, such as metals, but the invention could be implemented with a wide variety of materials, including various substrates and other support structures, various seed layers, and various plating materials. In particular, semiconductor and other non-metal substrates could be used, and various non-metal plating materials could be used, such as polypyrrole and other conductive polymers; ceramic coatings such as nickel-ceramic composites; and calcareous deposits. The following documents describing some such techniques are incorporated herein by reference: Shah, K., and Iroh, J. O., "Adhesion of Electrochemically Formed Conducting Polymer Coatings on Al-", *Surface Engineering*, vol. 20, no. 1, 1 Feb. 2004, pp. 53-58, abstracted at the ingenta Web site; Moreno, J. D., Marcos, M. L., Agulló-Rueda, F., Guerrero-Lemus, R., Martin-Palma, R. J., Martinez-Duart, J. M., and González-Velasco, J., "A galvanostatic study of the electrodeposition of polypyrrole into porous silicon", *Thin Solid Films*, 348, 1999, pp. 152-156; Jakob, C., Erler, F., Nutsch, R., Steinhäuser, S., Wielage, B., Zschunke, A., 15$^{th}$ Interfinish 2000 of the IUSF, Garmisch-Partenkirchen, Germany, 13-15 Sep. 2000, pp. 1-11; and the description of electrodeposition of calcareous deposits at the Stanford University Web site.

Some of the above exemplary implementations involve arrays of microstructures, but the invention could be implemented with a single microstructure, with or without a support structure.

The above exemplary implementations generally involve production of structures following particular operations, but different operations could be performed, the order of the operations could be modified, and additional operations could be added within the scope of the invention. For example, plating could be performed in many different ways and non-plateable or overhanging structures could be produced and positioned in any appropriate way. Also, rather than plating the entire side surface of a mold, only part of the side surface might be plated. Also, a seed layer might be removed from a mold's upper surface before plating.

While the invention has been described in conjunction with specific exemplary implementations, it is evident to those skilled in the art that many other alternatives, modifications, and variations will be apparent in light of the foregoing description. Accordingly, the invention is intended to embrace all other such alternatives, modifications, and variations that fall within the spirit and scope of the appended claims.

What is claimed is:

1. An article of manufacture comprising:
   a body; the body including:
      a base; and
      an array of two or more plated parts on the base; each plated part having:
         a respective top end disposed away from the base;
         at its top end, a respective upper surface that is disposed away from the base; and
         a respective side surface between the base and the respective upper surface; and
   a top structure that has a lower surface with two or more areas at each of which the top structure is supported over the respective upper surface of a respective one of the plated parts in the array, the respective plated part's top end including a limit artifact as a result of being adjacent to a non-plateable lower surface of a respective overhanging structure during plating; the limit artifact including at least one of the following:
      at least a part of the respective upper surface that is smooth;
      at least a part of the respective upper surface that is flat;
      at least a part of the respective upper surface that has no upward protrusions; and
      an L-shaped step between the respective upper surface and the side surface.

2. The article of claim 1 in which the body is a microstructure.

3. The article of claim 1 in which each plated part is metal.

4. The article of claim 3 in which each plated part includes at least one of gold, nickel, copper, iron, cobalt, lead, tin, bismuth, and indium.

5. The article of claim 1 in which the respective plated part of one of the areas has an opening at its top end.

6. The article of claim 5 in which the respective plated part of the one of the areas includes a lip around the opening at its top end, the lip including the plated part's upper surface, the upper surface having no protrusions extending from it.

7. The article of claim 5 in which the top structure has a hole defined in it over the opening at the plated part's top end.

8. The article of claim 5 in which the top structure's lower surface includes at least one of an opening, an indentation, and an alignment feature at the one of the areas with the respective non-plateable structure.

9. The article of claim 1, further comprising, on the respective plated part of one of the areas of the top structure's lower surface:
   the respective overhanging structure; the limit artifact being disposed toward the respective overhanging structure; the one of the areas being supported on the overhanging structure.

10. The article of claim 9 in which the body further includes, for the respective plated part of the one of the areas, a mold on which the plated part is formed; the overhanging structure being a polymer disk bonded to the mold's upper surface and the one of the areas being bonded to the polymer disk.

11. The article of claim 1 in which the body further includes, for the respective plated part of one of the areas of the top structure's lower surface, a mold on which the plated part is formed.

12. The article of claim 1 in which, for the respective plated part of one of the areas of the top structure's lower surface, the respective upper surface is entirely smooth and the respective side surface is irregular; the plated part having a curved transition surface between the smooth upper surface and the irregular side surface.

13. The article of claim 12 in which the plated part extends from the base to the smooth upper surface.

14. The article of claim 1 in which the respective plated part of one of the areas of the top structure's lower surface has a first opening defined in the top end; the upper surface extending around at least part of the first opening.

15. The article of claim 14 in which the upper surface is entirely smooth and extends around the entire first opening.

16. The article of claim 14 in which the upper surface includes a smooth first part that extends around a first part of the first opening; the upper surface also including a second part without a limit artifact, the second part of the upper surface extending around and over a second part of the first opening.

17. The article of claim 14 in which the plated part further has a second opening defined therein and disposed toward the base.

18. The article of claim 1 in which the body further includes:
   at least one wall-like structure extending between the base and the top structure, each wall-like structure including a respective one of the plated parts.

19. The article of claim 1 in which the top structure is attached to the upper surface of the respective plated part of each of the areas of the top structure's lower surface.

20. The article of claim 1 in which the top structure is a microchip.

21. The article of claim 1 in which the plated parts in the array have substantially equal lengths.

22. The article of claim 1 in which each plated part is tube-shaped.

23. The article of claim 1 in which each area of the top structure's lower surface is attached to a respective polymer structure over the respective plated part.

24. The article of claim 1 in which the base includes a steel plate, the respective plated part of each area of the top structure's lower surface including plated metal extending from the steel plate to the plated part's top end.

25. An article of manufacture comprising:
   a body; the body including:
      a base; and
      a plated part on the base; the plated part including:
         a top end disposed away from the base;
         defined in the plated part's top end, a top opening;
         at the plated part's top end, a first upper surface with a limit artifact, the limit artifact not being disposed toward the base; the first upper surface extending around a first part of the top opening; and
         at the plated part's top end, a second upper surface extending around and over a second part of the top opening.

26. The article of claim 25 in which the plated part is tube-shaped.

27. A method of producing the article of claim 25, comprising:
   forming a mold on the base of the article, the mold having a respective top end with a plateable upper surface bounded by an edge and, below the top end's edge, a plateable side;
   positioning an overhanging structure on a covered part of the plateable top surface but not on an uncovered part of the plateable top surface, the overhanging structure having a non-plateable lower surface extending over a first part of the edge of the plateable upper surface but not extending over a second part of the edge of the plateable upper surface;
   plating the plateable side of the mold and the uncovered part of the plateable top surface; the act of plating comprising:
      producing the first and second upper surfaces of the plated part; the first upper surface being adjacent the first part of the edge of the plateable upper surface and the second upper surface extending over the second part of the edge of the plateable upper surface.

28. An article of manufacture comprising:
   a body; the body including:
      a base; and
      a plated part on the base; the plated part including:
         a top end disposed away from the base; and
         a side surface between the base and the top end;
      the plated part's top end having an upper surface with a limit artifact, the limit artifact not being disposed toward the base; the limit artifact including, between the upper surface and the side surface, an L-shaped step.

29. The article of claim 28 in which the plated part further includes:
   a wall-like body that includes the plated part.

30. The article of claim 29 in which the wall-like body surrounds a cavity.

31. A method of manufacturing the article of claim 28, the method comprising:
   producing a mold on the base of the article, the mold having a respective top end and, below the top end, a plateable side;
   positioning an overhanging structure with a non-plateable lower surface on the mold's top end adjacent and extending over the plateable side, the non-plateable lower surface having an L-shaped part beyond the plateable side; and
   plating the plateable side of the mold; the act of plating comprising:
      producing the limit artifact that includes the L-shaped step between the upper surface and the side surface.

32. The method of claim 31 in which the plated part is tube-shaped with an opening at the top end; the act of plating further comprising:
   producing the upper surface adjacent the non-plateable lower surface without protrusions extending from the upper surface and with the upper surface being smooth.

33. An article of manufacture comprising:
   a body; the body including:
      a base; and
      an array of one or more plated parts on the base; at least one plated part including:
         a wall-like structure extending upward from the base to a top end disposed away from the base; the wall-like structure's top end having surface with a limit artifact, the limit artifact not being disposed toward the base;
         defined at the wall-like structure's top end, a top opening through which fluid can flow; the surface with the limit artifact extending around at least part of the top opening; and
         defined in the wall-like structure below the top end and above the base, a vent opening that allows pressure to equalize when fluid flows through the top opening.

34. The article of claim 33 in which, in the at least one plated part, the surface with the limit artifact is a smooth, even surface.

35. The article of claim 33 in which the at least one plated part is coated with a material that is hydrophilic, hydrophobic, or inert with respect to biomolecules.

* * * * *